United States Patent [19]

Yamamoto et al.

[11] Patent Number: 5,677,553
[45] Date of Patent: Oct. 14, 1997

[54] SEMICONDUCTOR DEVICE STRUCUTRE HAVING A TWO-DIMENSIONAL ELECTRON GAS AND CONTACT THERETO

[75] Inventors: Yoshitsugu Yamamoto; Naohito Yoshida, both of Itami, Japan

[73] Assignee: Mitsubishi Denki Kabushiki Kaisha, Tokyo, Japan

[21] Appl. No.: 358,712

[22] Filed: Dec. 19, 1994

[30] Foreign Application Priority Data

Dec. 24, 1993 [JP] Japan .................... 5-326558

[51] Int. Cl.[6] ............... H01L 31/0328; H01L 31/0336
[52] U.S. Cl. ........................... 257/192; 257/194
[58] Field of Search ......................... 257/192, 194, 257/280, 27, 29, 20

[56] References Cited

U.S. PATENT DOCUMENTS

| 4,961,194 | 10/1990 | Kiroda et al. | 257/192 |
|---|---|---|---|
| 5,285,087 | 2/1994 | Nanita et al. | 257/192 |
| 5,313,093 | 5/1994 | Nakagawa | 257/281 |
| 5,321,278 | 6/1994 | Nakagawa | 257/192 |
| 5,343,057 | 8/1994 | Gerard et al. | 257/192 |
| 5,422,307 | 6/1995 | Ishii | 437/184 |
| 5,446,296 | 8/1995 | Nakajima | 257/280 |

FOREIGN PATENT DOCUMENTS 9113466  2/1991  WIPO .

*Primary Examiner*—Wael Fahmy
*Attorney, Agent, or Firm*—Leydig, Voit & Mayer, Ltd.

[57] ABSTRACT

A semiconductor device includes a very low dopant impurity concentration InGaAs active layer in which a two-dimensional electron gas is produced, the active layer being disposed on a semiconductor substrate; a very low dopant impurity concentration spacer layer contacting the active layer at a first surface and having an electron affinity smaller than the electron affinity of the active layer; and a very thin InGaAs electron supply layer having a high n type dopant impurity concentration and contacting the spacer layer opposite the active layer. Degradation of device characteristics due to heating of the device is reduced with a result that a thermally stable and highly reliable semiconductor device is easily realized.

21 Claims, 14 Drawing Sheets

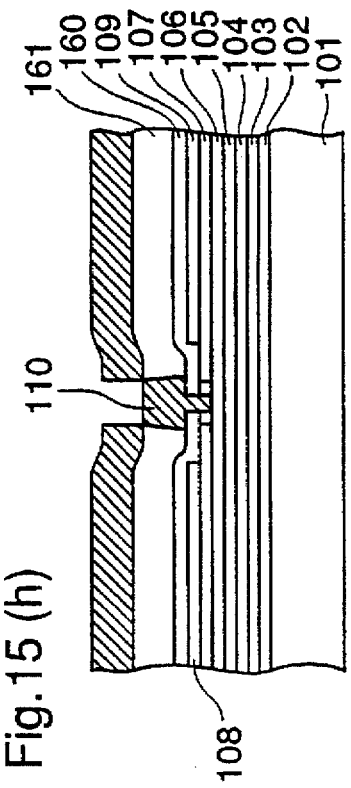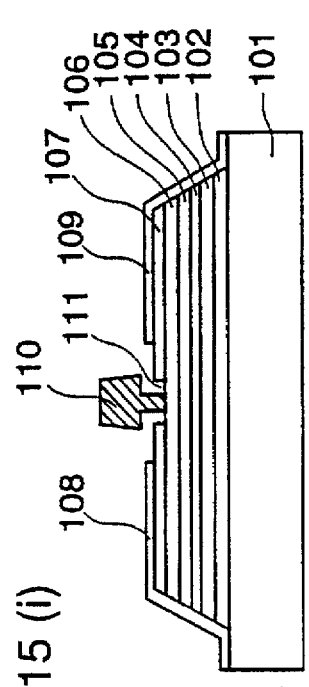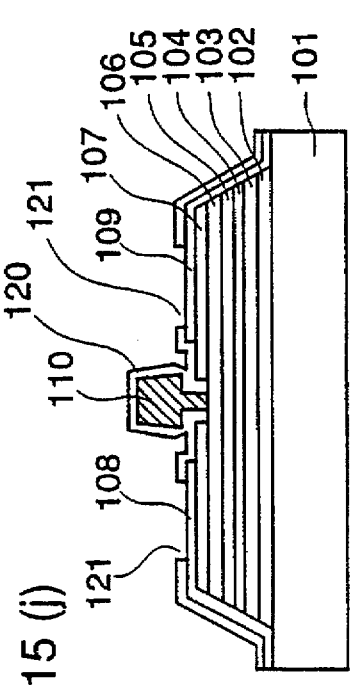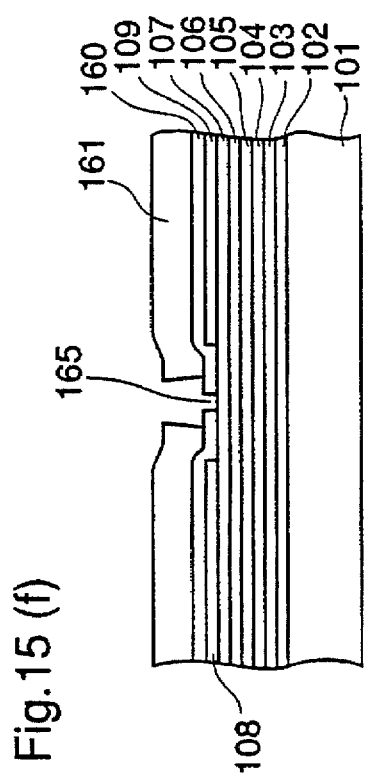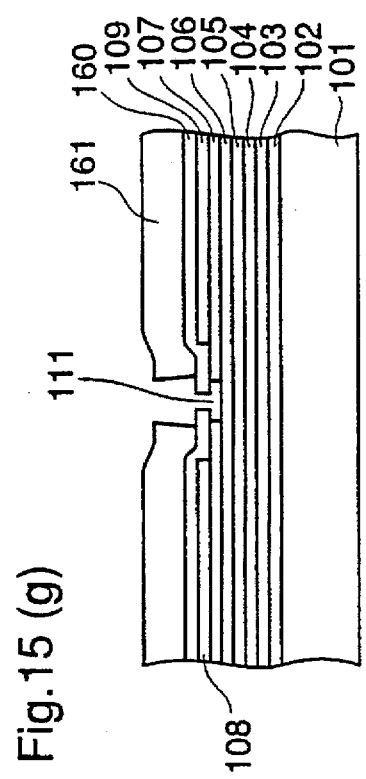

SEMICONDUCTOR DEVICE STRUCUTRE HAVING A TWO-DIMENSIONAL ELECTRON GAS AND CONTACT THERETO

FIELD OF THE INVENTION

The present invention relates to a semiconductor device utilizing a two-dimensional electron gas and having a high electron mobility, which is capable of operating at very high speed with very low noise.

BACKGROUND OF THE INVENTION

FIG. 12 is a sectional view illustrating a conventional semiconductor device comprising AlInAs and InGaAs and utilizing a two-dimensional electron gas. Usually, this semiconductor device is called a high electron mobility transistor (hereinafter referred to as a HEMT).

In the figure, reference numeral 101 designates a semi-insulating insulating InP substrate. An undoped AlInAs buffer layer 102 having a thickness of 250 nm is disposed on the InP substrate 101. The buffer layer 102 prevents current from the upper part of the structure from flowing into the substrate 101. An undoped InGaAs channel layer (active layer) 103 having a thickness of 50 nm is disposed on the buffer layer 102. Electrons travel through the undoped InGaAs active layer 103. An undoped AlInAs spacer layer 104 having a thickness of 2 nm is disposed on the channel layer 103. An Si-doped n type AlInAs electron supply layer 105 having a thickness of 10 nm and a dopant concentration of $4 \times 10^{18}$ cm$^{-3}$ is disposed on the spacer layer 104. The spacer layer 104 prevents the dopant impurity of the electron supply layer 105 from diffusing into the active layer 103. Since the electron supply layer 105 comprises AlInAs containing an n type impurity that provides an electron affinity smaller than that of the InGaAs active layer 103, the electron supply layer 105 produces a two-dimensional electron gas in the active layer 103. An undoped AlInAs Schottky layer 106 having a thickness of 10 nm is disposed on the electron supply layer 105. An Si-doped n type InGaAs contact layer 107 having a thickness of 10 nm and a dopant concentration of $4 \times 10^{18}$ cm$^{-3}$ is disposed on the Schottky layer 106. Portions of the contact layer 107 and the Schottky layer 106 are selectively removed to produce a recess 111. A gate electrode 100 is disposed on the Schottky layer 106 in the recess 111, making a Schottky junction with the Schottky layer 106. The gate electrode 100 controls Current. Source and drain electrodes 108 and 109 comprising AuGe base metal are disposed on the contact layer 107 at opposite sides of the gate electrode 110. The contact layer 107 alloys the source and drain electrodes 108 and 109 to make good ohmic contact. The source and drain electrodes 108 and 109 alloy the contact layer 107 to make electrical contact with the contact layer. In the figure, the width $W_1$ of the recess 111 is about 0.2 μm, and the gate length $W_2$ is about 0.15 μm. The respective undoped layers have very low impurity concentrations on the order of $10^{16}$ cm$^{-3}$ or less.

FIG. 13 is a plan view illustrating an arrangement of gate, drain, and source electrodes of a HEMT on a chip. In the figure, reference numeral 130 designates a chip, numeral 131 designates a source electrode, numeral 132 designates a drain electrode, and numeral 133 designates a gate electrode. The size of the chip is 450 μm×340 μm.

A description is given of the fabrication process of the conventional HEMT. FIGS. 15(a)–15(j) are sectional views illustrating fundamental process steps for fabricating the HEMT.

Initially, as illustrated in FIG. 15(a), there are successively grown on the InP substrate 101, the undoped AlInAs buffer layer 102, the undoped InGaAs channel layer 103, the undoped AlInAs spacer layer 104, the Si-doped n type AlInAs electron supply layer 105, the undoped AlInAs Schottky layer 106, and the Si-doped n type InGaAs contact layer 107. These layers are grown by molecular beam epitaxy (MBE) at a growth temperature of about 500° C.

After the epitaxial growth, as illustrated in FIG. 15(b), a prescribed part of the epitaxially grown structure is formed into a mesa by etching to isolate that part. Thereafter, spaced apart source and drain electrodes 108 and 109 are formed on the mesa structure (FIG. 15(c)).

Thereafter, a resist 160 for electron beam exposure (hereinafter referred to as EB resist) is deposited over the entire surface of the wafer and baked at 280° C. for an hour, and a photoresist 161 is deposited over the EB resist 160 (FIG. 15(d)). Then, the photoresist 161 is exposed to ultraviolet light 162 and developed to form a first stripe-shaped opening 163 (FIG. 15(e)).

Further, a portion of the EB resist 160 exposed in the opening 163 is exposed to an electron beam 164 and developed to form a second stripe-shaped opening 165 that is significantly narrower than the first opening 163 (FIG. 15(f)).

In the step of FIG. 15(g), a stripe-shaped recess 111 having a prescribed depth is formed by etching through the second opening 165. The recess 111 penetrates the contact layer 107 and reaches the Schottky layer 106. Then, a gate metal 110 is formed by sputtering (FIG. 15(h)), followed by removal of the EB resist 160 and the photoresist 161, resulting in a structure shown in FIG. 15(i).

Finally, a passivation film 120, such as a silicon oxide film, is formed over the entire surface of the wafer by plasma CVD, and portions of the passivation film 120 above the source and drain electrodes 108 and 109 are removed to form openings 121 for contacts, whereby a HEMT shown in FIG. 15(j) is completed.

A description is given of the operation. FIG. 14 is an energy band diagram of the HEMT shown in FIG. 12. In FIG. 14, the same reference numerals as those in FIG. 12 designate the same or corresponding parts. Reference character $E_C$ denotes an edge of the conduction band, and reference character $E_f$ denotes the Fermi level.

When a positive voltage is applied to the drain electrode 109 with the source electrode 108 grounded, electrons are supplied from ionized donor impurities 140 in the n type AlInAs electron supply layer 105 to the InGaAs active layer 103, whereby a two-dimensional electron gas is produced in a triangular potential well 150 that is formed at the boundary between the InGaAs active layer 103 and the AlInAs spacer layer 104. By means of this two-dimensional electron gas, current flows between the source and the drain.

When the gate voltage applied to the gate electrode 110 is increased toward the negative side, the drain current decreases because the two-dimensional electron gas beneath the gate decreases. On the other hand, if the gate voltage is increased toward the positive side, the drain current increases because the two-dimensional electrode gas beneath the gate increases. In this way, the HEMT is operated.

In the above-described semiconductor device, although an AlInAs layer is employed as the electron supply layer, it is known that AlInAs is thermally unstable. FIG. 16 is a graph illustrating temperature dependence of sheet carrier concentration when the semiconductor device shown in figure 12 is subjected to heat treatment in a nitrogen atmosphere at different temperatures. In the figure, the abscissa shows the temperature of the heat treatment and the ordinate shows the sheet carrier concentration. The time interval at each temperature is three minutes. As shown in FIG. 16, in the conventional semiconductor device including an AlInAs layer as the electron supply layer, the sheet carrier concentration suddenly decreases at a relatively low temperature. On the other hand, in the above-described production method of the conventional semiconductor device, there are many process steps in which the element is heated after the crystal growth process, for example, the heat treatment for alloying the source and drain electrodes with the contact layer, the baking of the resist for EB exposure, and the formation of the passivation film. However, since AlInAs is thermally unstable, the process steps in which the element is heated must be carried out at a sufficiently low temperature to maintain a prescribed sheet carrier concentration of the AlInAs electron supply layer. Therefore, it is difficult to produce a semiconductor device with improved characteristics.

Generally, the completed semiconductor device is subjected to a reliability test in which the device is stored in a high temperature atmosphere, for example, 200°, for a prescribed time interval and, thereafter, the electrical characteristics of the device are measured. The high temperature storage process in the reliability test adversely affects the characteristics of the semiconductor device, whereby the reliability of the device is significantly reduced.

Furthermore, in the conventional semiconductor device, since an AuGe base metal is used for the source and drain electrodes, the contact resistance between the source and drain electrodes and the n type InGaAs contact layer unfavorably increases in the heat treatment, i.e., annealing, for alloying the source and drain electrodes with the contact layer. FIG. 17 is a graph illustrating temperature dependence of contact resistance when semiconductor devices respectively including an AuGe base metal electrode and a Ti base metal electrode disposed on n type InGaAs contact layers are annealed at different temperatures. In the figure, the abscissa shows the temperature of the annealing and the ordinate shows the contact resistance $R_C$, and ◇ shows variations in the contact resistance of the semiconductor device including the AuGe base metal electrode and □ shows variations in the contact resistance of the semiconductor device including the Ti base metal electrode. As shown in the figure, when the semiconductor device including the AuGe base metal electrode or the Ti base metal electrode on the n type InGaAs contact layer is heated to a temperature exceeding 300° C., the contact resistance $R_C$ shows a considerable increase.

As a result, it is difficult to produce the conventional semiconductor device because low temperature processing must be employed to avoid the degradation of the characteristics. In addition, the reliability of the device is poor because the characteristics are degraded at a high temperature.

SUMMARY OF THE INVENTION

It is an object of the present invention to provide a semiconductor device utilizing a two-dimensional electron gas, that can be fabricated using a high temperature process and that has reliable characteristics after high temperature storage.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface and comprising a material having an electron affinity smaller than the electron affinity of the active layer; and a very thin InGaAs electron supply layer having a high n type impurity concentration and disposed on the spacer layer contacting a surface of the spacer layer opposite the surface contacting the active layer. Therefore, degradation of characteristics due to heating of the device is reduced, with a result that a thermally stable and highly reliable semiconductor device is easily realized.

According to a second aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface and comprising AlInAs; and a very thin InGaAs electron supply layer having a high n type dopant concentration and disposed on the spacer layer contacting a surface of the spacer layer opposite the surface contacting the active layer. Therefore, degradation of characteristics of the device due to heating of the device is reduced, with a result that a thermally stable and highly reliable semiconductor device is easily realized.

According to a third aspect of the present invention, a semiconductor device includes an InGaAs active layer in which two-dimensional electron gas is produced, which a active layer is disposed on a semiconductor substrate and has an impurity concentration on the order of $10^{16}$ cm$^{-3}$ or less; a spacer layer contacting the active layer at a surface, which spacer layer comprises a material having an electron affinity smaller than the electron affinity of the active layer and has an impurity concentration on the order of $10^{16}$ cm$^{-3}$ or less; and a very thin InGaAs electron supply layer having a high n type dopant concentration and disposed on the spacer layer contacting a surface of the spacer layer opposite the surface contacting the active layer. Therefore, degradation of characteristics due to heating of the device is reduced, with a result that a thermally stable and highly reliable semiconductor device is easily realized.

According to a fourth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface and comprising a material having an electron affinity smaller than an electron affinity of a material of the active layer; and an InGaAs electron supply layer about 1 nm thick having a high n type dopant concentration and disposed on the spacer layer contacting a surface of the spacer layer opposite the surface contacting the active layer. Therefore, degradation of characteristics due to heating of the device is reduced, with a result that a thermally stable and highly reliable semiconductor device is easily realized.

According to a fifth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface and comprising a material having an electron affinity smaller than the electron affinity of the active layer; and a very thin InGaAs electron supply layer which is entirely doped with an n type impurity, having an n type dopant concentration on the order of $10^{18}$ cm$^{-3}$ or more and disposed on the spacer layer contacting a surface of the spacer layer opposite the surface contacting the active layer. Therefore, degradation of characteristics due to heating of the device is reduced, with a result that a thermally stable and highly reliable semiconductor device is easily realized.

According to a sixth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface and comprising a material having an electron affinity smaller than the electron affinity of the active layer; and a very thin InGaAs electron supply layer disposed on the spacer layer contacting a surface of the spacer layer opposite the surface contacting the active layer, which electron supply layer includes a planar doped n type layer that is formed by atomic planar doping of an n type impurity into the very low impurity concentration InGaAs layer. Therefore, degradation of characteristics due to heating of the device is reduced, with a result that a thermally stable and highly reliable semiconductor device is easily realized.

According to a seventh aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface and comprising a material having an electron affinity smaller than the electron affinity of the active layer; and an InGaAs electron supply layer about 1 nm thick disposed on the spacer layer contacting a surface of the spacer layer opposite the surface contacting the active layer, which electron supply layer includes a planar doped n type layer having a sheet carrier concentration on the order of $10^{12}$ cm$^{-2}$ that is formed by atomic planar doping of an n type impurity into the very low impurity concentration InGaAs layer. Therefore, degradation of characteristics due to heating of the device is reduced, with a result that a thermally stable and highly reliable semiconductor device is easily realized.

According to an eighth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface and comprising a material having an electron affinity smaller than the electron affinity of the active layer; and a very thin InGaAs electron supply layer having a high n type dopant concentration and disposed on the spacer layer contacting a surface of the spacer layer opposite the surface contacting the active layer, wherein the composition ratio of Ga to In of the electron supply layer is larger than the composition ratio of Ga to In of the active layer. Therefore, degradation of characteristics due to heating of the device is reduced, with a result that a thermally stable and highly reliable semiconductor device is easily realized.

According to a ninth aspect of the present invention, a semiconductor device includes a very low impurity concentration In$_y$Ga$_{1-y}$As (0.53<y<1) active layer in which a two-dimensional electron gas is produced, which active layer is disposed on an InP semiconductor substrate; a very low impurity concentration spacer layer contacting the active layer at a surface and comprising a material having the electron affinity smaller than an electron affinity of the active layer; and a very thin In$_x$Ga$_{1-x}$As (0<x<0.53) electron supply layer having a high n type dopant concentration and disposed on the spacer layer contacting a surface of the spacer layer opposite the surface contacting the active layer. Therefore, degradation of characteristics due to heating of the device is reduced, with a result that a thermally stable and highly reliable semiconductor device is easily realized.

According to a tenth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface of the active layer opposite the surface contacting the substrate and comprising a material having an electron affinity smaller than the electron affinity of the active layer; a very thin InGaAs electron supply layer having a high n type dopant concentration and disposed on the spacer layer contacting a surface of the spacer layer opposite the surface contacting the active layer; a very low impurity concentration Schottky layer disposed on the electron supply layer and comprising a material that has an electron affinity smaller than the electron affinity of the active layer for making a Schottky junction; a gate electrode disposed on the Schottky layer, making a Schottky junction with the Schottky layer; InGaAs contact layers having a high n type dopant concentration and disposed on portions of the Schottky layer at opposite sides of the gate electrode; and source and drain electrodes disposed on the contact layers. Therefore, degradation of characteristics due to heating of the device is reduced, with a result that a thermally stable and highly reliable semiconductor device is easily realized.

According to an eleventh aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface of the active layer facing the substrate and comprising a material having an electron affinity smaller than the electron affinity of the active layer; a very thin InGaAs electron supply layer having a high n type dopant concentration and disposed on the spacer layer contacting a surface of the spacer layer opposite the surface contacting the active layer; a very low impurity concentration Schottky layer disposed on the active layer and comprising a material that has an electron affinity smaller than the electron affinity of the active layer for making a Schottky junction; a gate electrode disposed on the Schottky layer, making a Schottky junction with the Schottky layer; InGaAs contact layers having a high n type dopant concentration and disposed on portions of the Schottky layer at opposite sides of the gate electrode; and source and drain electrodes disposed on the contact layers. Therefore, degradation of characteristics due to heating of the device is reduced, with a result that a thermally stable and highly reliable semiconductor device is easily realized.

According to a twelfth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface of the active layer opposite the surface contacting the substrate and comprising a material having an electron affinity smaller than the electron affinity of the active layer; a very thin InGaAs electron supply layer having a high n type dopant concentration and disposed on the spacer layer contacting a surface of the spacer layer opposite the surface contacting the active layer; a Schottky layer having an impurity concentration on the order of $10^{16}$ cm$^{-3}$ or less and comprising a material that has an electron affinity smaller than the electron affinity of the active layer for making a Schottky junction, which Schottky layer is disposed on the electron supply layer; a gate electrode disposed on the Schottky layer, making a Schottky junction with the Schottky layer; InGaAs contact layers having a high n type dopant concentration and disposed on portions of the Schottky layer at opposite sides of the gate electrode; and source and drain electrodes disposed on the contact layers. Therefore, degradation of characteristics due to heating of the device is reduced, with a result that a thermally stable and highly reliable semiconductor device is easily realized.

According to a thirteenth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface of the active layer facing the substrate and comprising a material having an electron affinity smaller than the electron affinity of the active layer; a very thin InGaAs electron supply layer having a high n type dopant concentration and disposed on the spacer layer contacting a surface of the spacer layer opposite the surface contacting the active layer; a Schottky layer having an impurity concentration on the order of $10^{16}$ cm$^{-3}$ or less and comprising a material that has an electron affinity smaller than the electron affinity of the active layer for making a Schottky junction, which Schottky layer is disposed on the active layer; a gate electrode disposed on the Schottky layer, making a Schottky junction with the Schottky layer; InGaAs contact layers having a high n type dopant concentration and disposed on portions of the Schottky layer at opposite sides of the gate electrode; and source and drain electrodes disposed on the contact layers. Therefore, degradation of characteristics due to heating of the device is reduced, with a result that a thermally stable and highly reliable semiconductor device is easily realized.

According to a fourteenth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface of the active layer Opposite the surface contacting the substrate and comprising a material having an electron affinity smaller than the electron affinity of the active layer; a very thin InGaAs electron supply layer having a high n type dopant concentration and disposed on the spacer layer contacting a surface of the spacer layer opposite the surface contacting the active layer; a very low impurity concentration Schottky layer comprising a material that has an electron affinity smaller than the electron affinity of the active layer for making a Schottky junction, which Schottky layer is disposed on the electron supply layer; a gate electrode disposed on the Schottky layer, making a Schottky junction with the Schottky layer; InGaAs contact layers having a high n type dopant concentration and disposed on portions of the Schottky layer at opposite sides of the gate electrode; and source and drain electrodes disposed on the contact layers, which source and drain electrodes comprise $W_{1-x}Si_x$ ($0 \leq x \leq 1$) base metal layers in contact with the contact layers. Therefore, degradation of characteristics due to heating of the device is reduced, with a result that a thermally stable and highly reliable semiconductor device is easily realized.

According to a fifteenth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface of the active layer facing the substrate and comprising a material having an electron affinity smaller than the electron affinity of the active layer; a very thin InGaAs electron supply layer having a high n type dopant concentration and disposed on the spacer layer contacting a surface of the spacer layer opposite the surface contacting the active layer; a very low impurity concentration Schottky layer comprising a material that has an electron affinity smaller than the electron affinity of the active layer for making a Schottky junction, which Schottky layer is disposed on the active layer; a gate electrode disposed on the Schottky layer, making a Schottky junction with the Schottky layer; InGaAs contact layers having a high n type dopant concentration and disposed on portions of the Schottky layer at opposite sides of the gate electrode; and source and drain electrodes disposed on the contact layers, which source and drain electrodes comprise $W_{1-x}Si_x$ ($0 \leq x \leq 1$) base metal layers in contact with the contact layers. Therefore, degradation of characteristics due to heating of the device is reduced, with a result that a thermally stable and highly reliable semiconductor device is easily realized.

According to a sixteenth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface of the active layer opposite the surface contacting the substrate and comprising a material having an electron affinity smaller than the electron affinity of the active layer; a very thin InGaAs electron supply layer having a high n type dopant concentration and disposed on the spacer layer contacting a surface of the spacer layer opposite the surface contacting the active layer; a very low impurity concentration Schottky layer comprising a material that has an electron affinity smaller than the electron affinity of the active layer for making a Schottky junction, which Schottky layer is disposed on the electron supply layer; a gate electrode disposed on the Schottky layer, making a Schottky junction with the Schottky layer; InGaAs contact layers having a high n type dopant concentration and disposed on portions of the Schottky layer at opposite sides of the gate electrode; and source and drain electrodes disposed on the contact layers, which source and drain electrodes comprise $W_{1-x}Si_x$ ($0 \leq x \leq 1$) base metal layers in contact with the contact layers and Au layers disposed on the $W_{1-x}Si_x$ ($0 \leq x \leq 1$) base metal layers. Therefore, a thermally stable semiconductor device with improved characteristics is realized.

According to a seventeenth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface of the active layer facing the substrate and comprising a material having an electron affinity smaller than the electron affinity of the active layer; a very thin InGaAs electron supply layer having a high n type dopant concentration and disposed on the spacer layer contacting a surface of the spacer layer opposite the surface contacting the active layer; a very low impurity concentration Schottky layer comprising a material that has an electron affinity smaller than the electron affinity of the active layer for making a Schottky junction, which Schottky layer is disposed on the active layer; a gate electrode disposed on the Schottky layer, making a Schottky junction with the Schottky layer; InGaAs contact layers having a high n type dopant concentration and disposed on portions of the Schottky layer at opposite sides of the gate electrode; and source and drain electrodes disposed on the contact layers, which source and drain electrodes comprise $W_{1-x}Si_x$ ($0 \leq x \leq 1$) base metal layers in contact with the contact layers and Au layers disposed on the $W_{1-x}Si_x$ ($0 \leq x \leq 1$) base metal layers. Therefore, a thermally stable semiconductor device with improved characteristics is realized.

According to an eighteenth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface of the active layer opposite the surface contacting the substrate and comprising a material having an electron affinity smaller than the electron affinity of the active layer; a very thin InGaAs electron supply layer having a high n type dopant concentration and disposed on the spacer layer contacting a surface of the spacer layer opposite the surface contacting the active layer; a very low impurity concentration Schottky layer comprising a material that has an electron affinity smaller than the electron affinity of the active layer for making a Schottky junction, which Schottky layer is disposed on the electron supply layer; a gate electrode disposed on the Schottky layer, making a Schottky junction with the Schottky layer; InGaAs contact layers having a high n type dopant concentration and disposed on portions of the Schottky layer at opposite sides of the gate electrode; and source and drain electrodes disposed on the contact layers. In this structure, the source and drain electrodes comprise $W_{1-x}Si_x$ ($0 \leq x \leq 1$) base metal layers in contact with the contact layers, and the contact layers include regions in which an n type impurity is doped by atomic planar doping, in the vicinity of the interface with the source and drain electrodes. Therefore, a favorable contact is made, resulting in a thermally stable semiconductor device with improved characteristics.

According to a nineteenth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface of the active layer facing the substrate and comprising a material having an electron affinity smaller than the electron affinity of the active layer; a very thin InGaAs electron supply layer having a high n type dopant concentration and disposed on the spacer layer contacting a surface of the spacer layer opposite the surface contacting the active layer; a very low impurity concentration Schottky layer comprising a material that has an electron affinity smaller than the electron affinity of the active layer for making a Schottky junction, which Schottky layer is disposed on the active layer; a gate electrode disposed on the Schottky layer, making a Schottky junction with the Schottky layer; InGaAs contact layers having a high n type dopant concentration and disposed on portions of the Schottky layer at opposite sides of the gate electrode; and source and drain electrodes disposed on the contact layers. In this structure, the source and drain electrodes comprise $W_{1-x}Si_x$ ($0 \leq x \leq 1$) base metal layers in contact with the contact layers, and the contact layers include regions in which an n type impurity is doped by atomic planar doping, in the vicinity of the interface with the source and drain electrodes. Therefore, a favorable contact is made, resulting in a thermally stable semiconductor device with improved characteristics.

According to a twentieth aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface of the active layer opposite the surface contacting the substrate and comprising a material having an electron affinity smaller than the electron affinity of the active layer; a very thin InGaAs electron supply layer having a high n type dopant concentration and disposed on the spacer layer contacting a surface of the spacer layer opposite the surface contacting the active layer; a very low impurity concentration Schottky layer comprising a material that has an electron affinity smaller than the electron affinity of the active layer for making Schottky junction, which Schottky layer is disposed on the electron supply layer; a gate electrode disposed on the Schottky layer, making a Schottky junction with the Schottky layer; InGaAs contact layers having a high n type dopant concentration and disposed on portions of the Schottky layer at opposite sides of the gate electrode; and source and drain electrodes disposed on the contact layers. In this structure, the source and drain electrodes comprise $W_{1-x}Si_x$ ($0 \leq x \leq 1$) base metal layers in contact with the contact layers, and the contact layers include n type regions at the interface with the Schottky layer, which n type regions are formed by atomic planar doping of n type impurity. Therefore, the resistance between the contact layer and the Schottky layer is reduced, resulting in a thermally stable semiconductor device with improved characteristics.

According to a twenty-first aspect of the present invention, a semiconductor device includes a very low impurity concentration InGaAs active layer in which a two-dimensional electron gas is produced, which active layer is disposed on a semiconductor substrate; a very low impurity concentration spacer layer contacting the active layer at a surface of the active layer facing the substrate and comprising a material having an electron affinity smaller than the electron affinity of the active layer; a very thin InGaAs electron Supply layer having a high n type dopant concentration and disposed on the spacer layer contacting a surface of the spacer layer opposite the surface contacting the active layer; a very low impurity concentration Schottky layer comprising a material that has an electron affinity smaller than the electron affinity of the active layer for making a Schottky junction, which Schottky layer is disposed on the active layer; a gate electrode disposed on the Schottky layer, making a Schottky junction with the Schottky layer; InGaAs contact layers having a high n type dopant concentration and disposed on portions of the Schottky layer at opposite sides of the gate electrode; and source and drain electrodes disposed on the contact layers. In this structure, the source and drain electrodes comprise $W_{1-x}Si_x$ ($0 \leq x \leq 1$) base metal layers in contact with the contact layers, and the contact layers include n type regions at the interface with the Schottky layer, which n type regions are formed by atomic planar doping of n type impurity. Therefore, the resistance between the contact layer and the Schottky layer is reduced, resulting in a thermally stable semiconductor device with improved characteristics.

According to a twenty-second aspect of the present invention, in a semiconductor device including an InGaAs contact layer having a high n type dopant concentration and ohmic electrodes disposed on the contact layer, the ohmic electrodes include $W_{1-x}Si_x$ ($0 \leq x \leq 1$) base metal layers in contact with the contact layer. Therefore, a thermally stable semiconductor device is realized.

According to a twenty-third aspect of the present invention, in a semiconductor device including an InGaAs contact layer having a high n type dopant concentration and ohmic electrodes disposed on the contact layer, the ohmic electrodes include $W_{1-x}Si_x$ ($0 \leq x \leq 1$) base metal layers in contact with the contact layer and Au layers disposed on the $W_{1-x}Si_x$ ($0 \leq x \leq 1$) base metal layers. Therefore, a thermally stable semiconductor device with improved characteristics is realized.

According to a twenty-fourth aspect of the present invention, in a semiconductor device including an InGaAs contact layer having a high n type dopant concentration and ohmic electrodes disposed on the contact layer, the ohmic electrodes include $W_{1-x}Si_x$ ($0 \leq x \leq 1$) base metal layers in contact with the contact layer, and the contact layer includes an n type region in the vicinity of the interface between the contact layer and the ohmic electrodes, which n type region is formed by atomic planar doping of an n type impurity. Therefore, a favorable contact is made, resulting in a thermally stable semiconductor device with improved characteristics.

According to a twenty-fifth aspect of the present invention, in a semiconductor device including an InGaAs contact layer having a high n type dopant concentration and ohmic electrodes disposed on the contact layer, the ohmic electrodes include $W_{1-x}Si_x$ ($0 \leq x \leq 1$) base metal layers in contact with the contact layer, and the contact layer includes an n type layer at the interface between the contact layer and an underlying layer comprising a semiconductor material other than the contact layer, which n type layer is formed by atomic planar doping of an n type impurity. Therefore, the resistance between the contact layer and a Schottky layer is reduced, resulting in a thermally stable semiconductor device with improved characteristics.

DETAILED DESCRIPTION OF THE PREFERRED EMBODIMENTS

[Embodiment 1]

Figure 1:
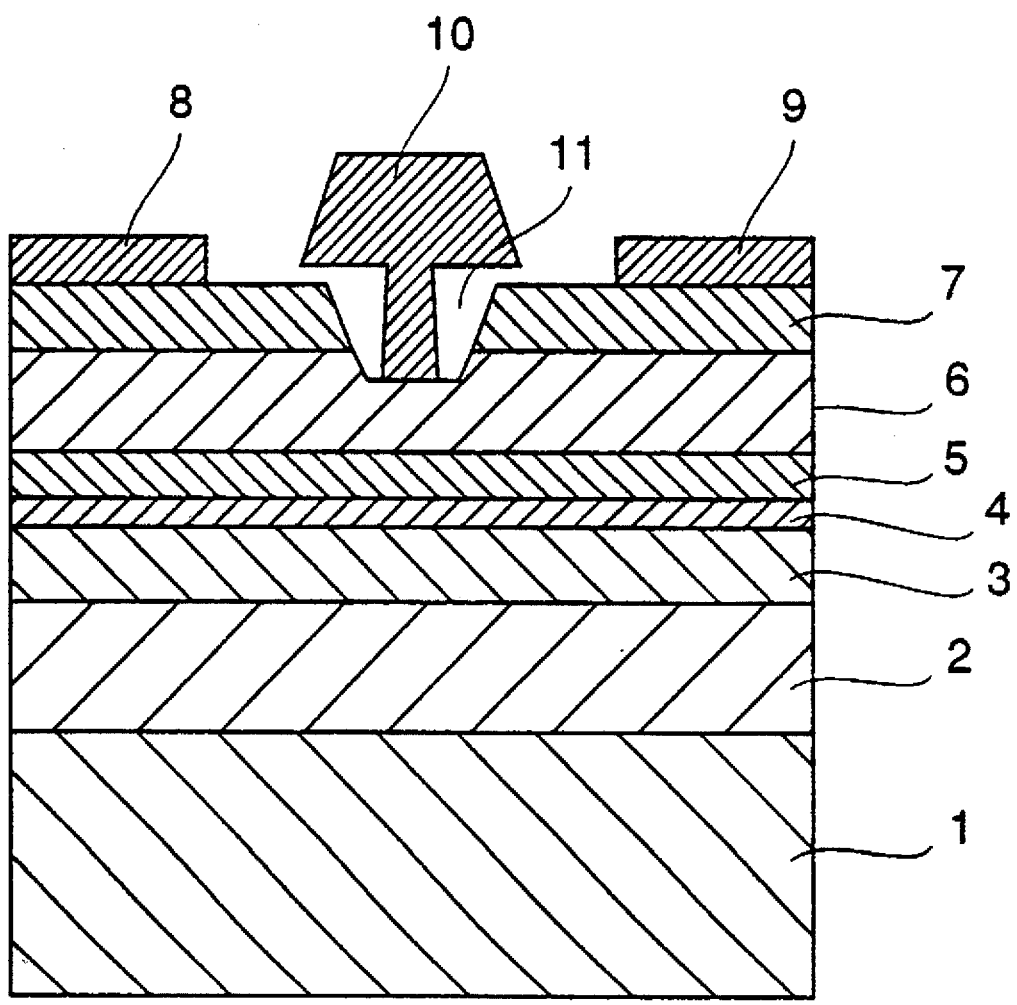
FIG. 1 is a sectional view illustrating a semiconductor device in accordance with a first embodiment of the present invention.

FIG. 1 is a sectional view illustrating a HEMT as a semiconductor device in accordance with a first embodiment of the present invention.

In the figure, reference numeral 1 designates a semi-insulating InP substrate. An undoped $Al_{0.48}In0.52As$ buffer layer 2 having a thickness of 250 nm is disposed on the substrate 101. An undoped $In_{0.53}Ga_{0.47}As$ channel layer 3 having a thickness of 50 nm is disposed on the buffer layer 2. An undoped $Al_{0.48}In_{0.52}As$ Spacer layer 4 having a thickness of 2 nm is disposed on the channel layer 3. An Si-doped n type $In_{0.53}Ga_{0.47}As$ electron supply layer 5 having a thickness of 1 nm and a dopant concentration of $4 \times 10^{18}$ cm$^{-3}$ is disposed on the spacer layer 4. An undoped $Al_{0.48}In_{0.52}As$ Schottky layer 6 having a thickness of 20 nm is disposed on the electron supply layer 5. An Si-doped n type $In_{0.53}Ga_{0.47}As$ contact layer 7 having a thickness of 10 nm and a dopant concentration of $4 \times 10^{18}$ cm$^{-3}$ is disposed on the Schottky layer 6. A recess 11 having a prescribed depth penetrates through the contact layer 7 and reaches into the Schottky layer 6. Spaced apart source and drain electrodes 8 and 9 are disposed on the contact layer 7 at opposite sides of the recess 11. A gate electrode 10 is disposed on the Schottky layer 6 in the recess 11. The width of the recess 11 is about 0.2 µm, and the gate length is about 0.15 µm. The undoped layers have a very low impurity concentration, on the order of $10^{16}$ cm$^{-3}$ or less.

The semiconductor device according to the first embodiment of the invention is different from the conventional semiconductor device in that a very thin n type InGaAs layer is employed as the electron supply layer 5 in place of n type AlInAs.

Figure 2:
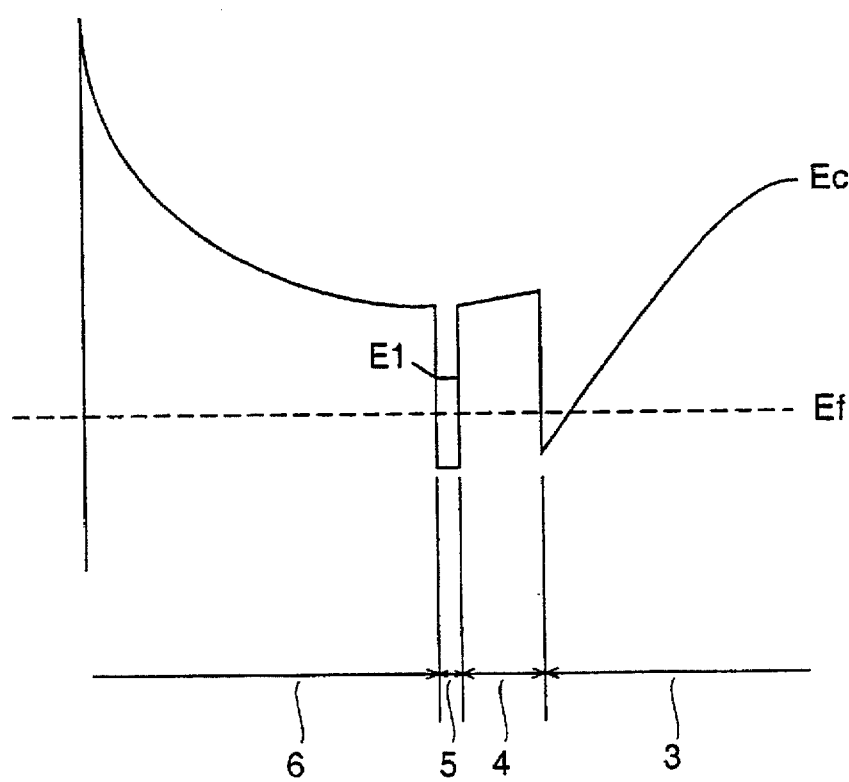
FIG. 2 is an energy band diagram of the semiconductor device according to the first embodiment of the invention.

FIG. 2 is an energy band diagram of the semiconductor device according to the first embodiment of the invention. When n type InGaAs is employed for the electron supply layer 5, the conduction band edge of the electron supply layer 5 is lower than the Fermi level $E_f$. However, when the n type InGaAs electron supply layer is as thin as 1 nm, a sub-band $E_1$ is formed at a position higher than the Fermi level $E_f$ due to the quantum effect as shown in FIG. 2. Since ionized electrons cannot take an energy lower than the sub-band $E_1$, the electron supply layer 5 is depleted, whereby a two-dimensional electron gas is induced between the spacer layer 4 and the channel layer 3. As a result, the same operation as the conventional device is achieved.

A description is given of the thermal stability of the semiconductor device according to the first embodiment of the invention.

Figure 3:
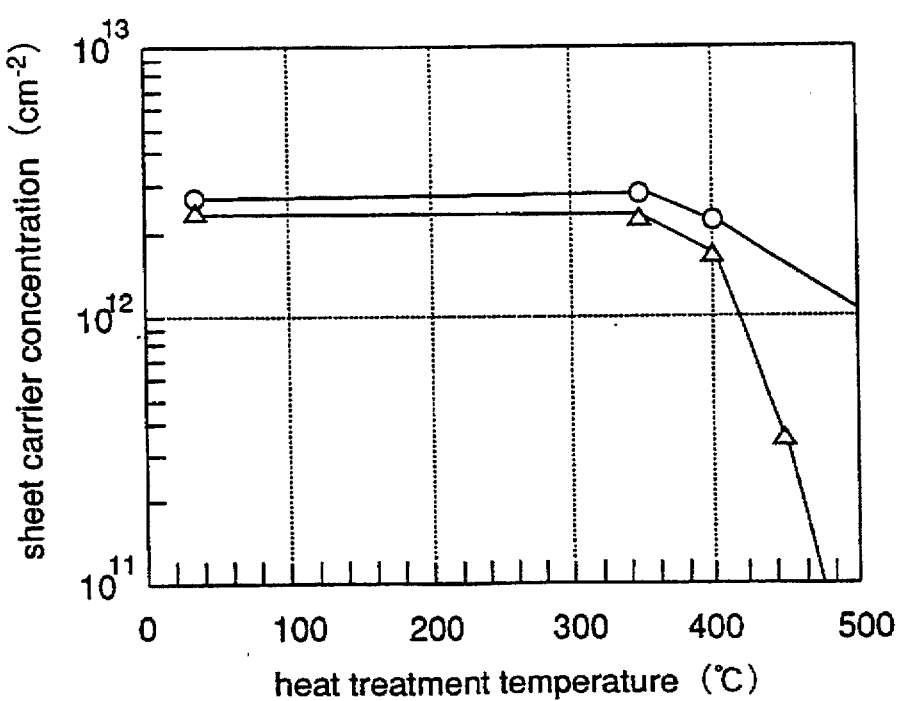
FIG. 3 is a graph for explaining the thermal stability of the semiconductor device according to the first embodiment of the invention.

FIG. 3 is a graph illustrating temperature dependence of sheet carrier concentration when the semiconductor device of the first embodiment is heated in a nitrogen atmosphere at different temperatures. In the figure, the abscissa shows the temperature of the heat treatment and the ordinate shows the sheet carrier concentration. The sheet carrier concentration of the semiconductor device according to the first embodiment of the invention is shown by ○. For comparison, the sheet carrier concentration of the conventional device is shown by Δ. The time interval at each temperature is three minutes. As seen from the figure, the sheet carrier concentration of the conventional device suddenly decreases in the heat treatment at about 400° C., which indicates that the thermal stability of the conventional device is very poor. On the other hand, the sheet carrier concentration of the semiconductor device according to the first embodiment does not vary very much, which indicates that the semiconductor device of the first embodiment has a high thermal stability.

As described above, according to the first embodiment of the present invention, the HEMT employing InGaAs for the channel layer 3 includes the very thin electron supply layer 5 comprising thermally stable n type InGaAs. Therefore, high temperature processing can be employed in the production process of the HEMT, whereby a semiconductor device with improved characteristics is easily produced. In addition, since the completed device is thermally stable, the reliability of the device is significantly increased.

[Embodiment 2]

Figure 4:
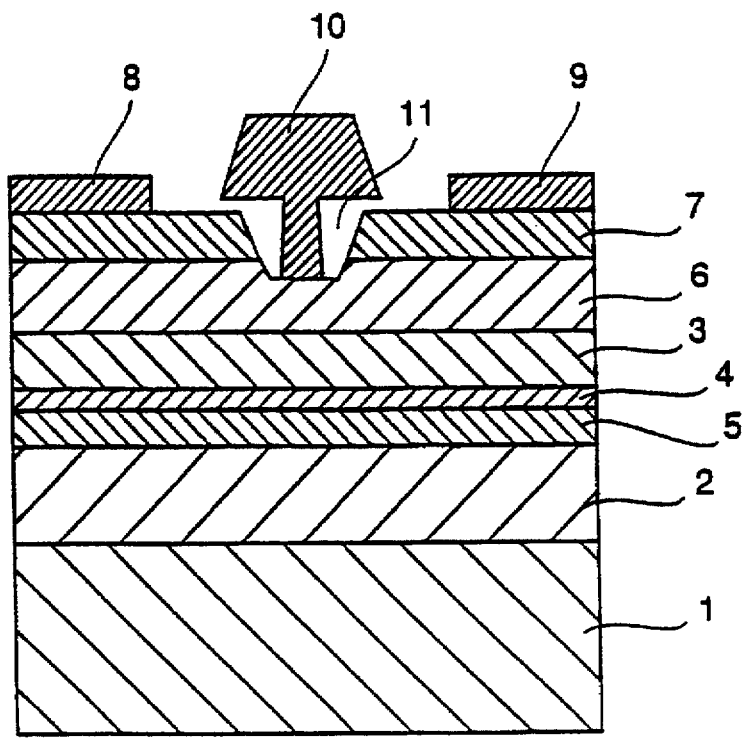
FIG. 4 is a sectional view illustrating a semiconductor device in accordance with a second embodiment of the present invention.
Figure 5:
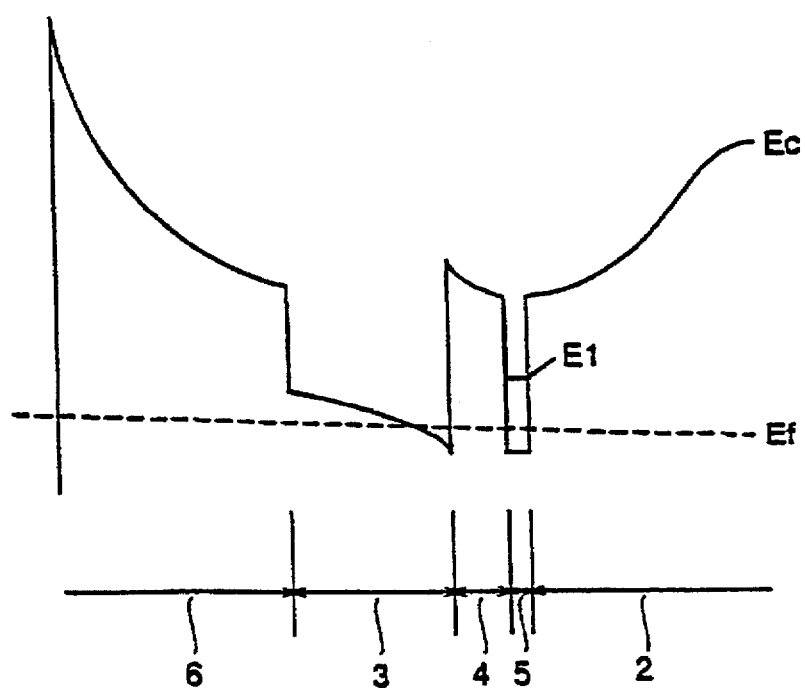
FIG. 5 is an energy band diagram of the semiconductor device according to the second embodiment of the invention.

FIG. 4 is a sectional view illustrating a semiconductor device in accordance with a second embodiment of the present invention. In the figure, the same reference numerals as in FIG. 1 designate the same or corresponding parts. FIG. 5 is an energy band diagram of the semiconductor device shown in FIG. 4.

While in the above-described first embodiment the electron supply layer 5 is located above the active layer 3, in this second embodiment the positions of the electron supply layer 5 and the active layer 3 are reversed, i.e., the active layer 3 is located above the electron supply layer 5. This structure is called an inverse HEMT structure. The operation of the reversed HEMT is identical to that of the ordinary HEMT shown in FIG. 1. That is, when the source electrode 8 is grounded and a positive voltage is applied to the drain electrode 9, electrons are supplied from ionized donor impurities in the n type InGaAs electron supply layer 5 to the InGaAs active layer 3, whereby a two-dimensional electron gas is produced in a triangular potential well formed at the boundary between the InGaAs active layer 3 and the AlInAs spacer layer 4. By mean of the two-dimensional electron gas, current flows between the source and the drain. When the gate voltage applied to the gate electrode 10 is increased toward the negative side, the drain current decreases because the two-dimensional electron gas beneath the gate decreases. On the other hand, when the gate voltage is increased toward the positive side, the drain current increases because the two-dimensional electron gas beneath the gate increases. In this way, the HEMT is operated.

In this second embodiment of the invention, since the semiconductor device includes the very thin electron supply layer 5 comprising thermally stable n type InGaAs as in the above-described first embodiment, high temperature processing can be employed in the production of the semiconductor device, so that a semiconductor device with improved characteristics is easily produced. In addition, since the thermal stability of the completed device is high, the reliability of the device is significantly improved.

[Embodiment 3]

Figure 6:
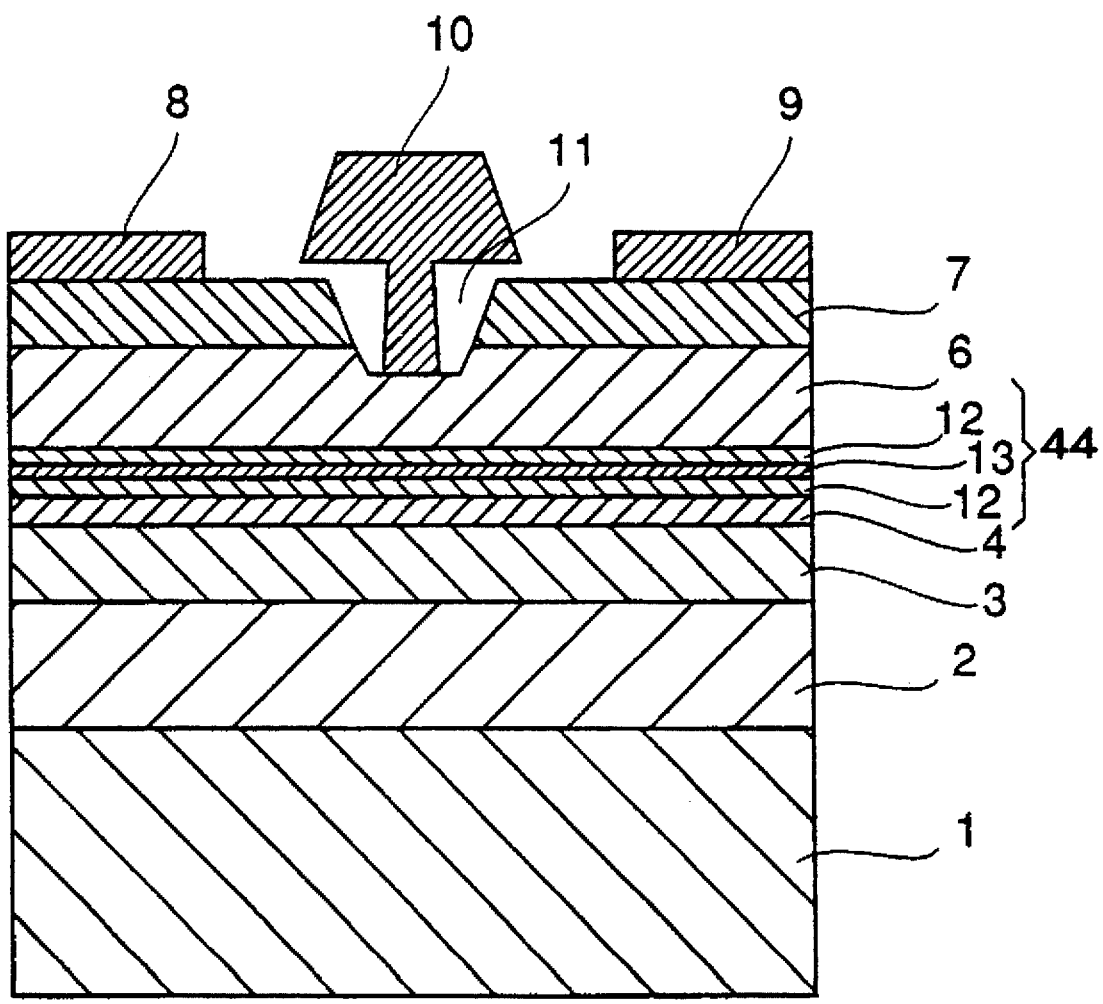
FIG. 6 is a sectional view illustrating a semiconductor device in accordance with a third embodiment of the present invention.

FIG. 6 is a sectional view of a semiconductor device in accordance with a third embodiment of the present invention. In the figure, the same reference numerals as in FIG. 1 designate the same or corresponding parts.

While in the above-described first embodiment the electron supply layer 5 comprises InGaAs entirely doped with an n type impurity, an electron supply layer 44 of this third embodiment has a multilayer structure in which an n type impurity doped layer 13 that is formed by an atomic planar doping technique (hereinafter referred to as an atomic planar doped layer) is interposed between a pair of undoped InGaAs layers 12.

The atomic planar doped layer 13 is formed by the following process. That is, in an MBE (Molecular Beam Epitaxy) process, irradiation of the substrate by a molecular beam including Group III atoms, such as In or Ga, that controls the growth rate is stopped while irradiation with an AS molecular beam continues, and the substrate is irradiated with a molecular beam of dopant impurity, such as Si. The dopant concentration of the atomic planar doped layer is determined by the product of the intensity of the dopant molecular beam and the irradiation time. In this third embodiment, the sheet carrier concentration of the atomic planar doped layer 13 is on the order of $10^{12}$ cm$^{-2}$.

Also in this third embodiment of the invention, since InGaAs is used for the electron supply layer 44, the conduction band edge of the electron supply layer 44 is lower than the Fermi level. However, when the total thickness of the electron supply layer 44 is reduced to about 1 nm, a sub-band is formed at a position higher than the Fermi level due to a quantum effect, and the electron supply layer 44 is depleted, inducing a two-dimensional electron gas between the spacer layer 4 and the active layer 3. Thus, the semiconductor device of this third embodiment operates in the same manner as the conventional device. Further, since InGaAs is thermally stable, high temperature processing can be employed in the production, whereby a semiconductor device with improved characteristics is easily produced. In addition, since the completed device has a high thermal stability, the reliability of the device is significantly increased.

Furthermore, in this third embodiment of the invention, since the electron supply layer 44 has a multilayer structure in which the n type impurity atomic planar doped layer 13 is interposed between the very low impurity concentration InGaAs layers 12, the n type impurities in the electron supply layer do not diffuse to other layers. Therefore, a steep band discontinuity is produced, whereby the concentration of the two-dimensional electron gas is increased, resulting in a high-performance HEMT.

[Embodiment 4]

Figure 18:
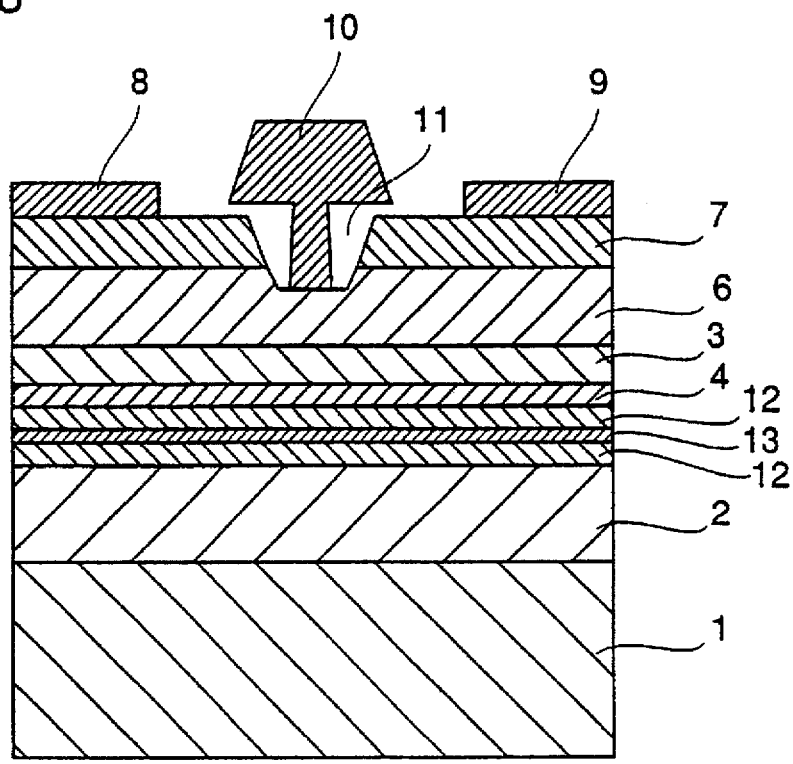
FIG. 18 is a sectional view illustrating a semiconductor device in accordance with a fourth embodiment of the present invention.

FIG. 18 is a sectional view illustrating a semiconductor device in accordance with a fourth embodiment of the present invention. In the figure, the same reference numerals as in FIG. 6 designate the same or corresponding parts.

In the above-described third embodiment, the electron supply layer of the ordinary HEMT in which the electron supply layer is located above the active layer has the multilayer structure in which the n type impurity planar doped layer 13 is sandwiched between the very low impurity concentration InGaAs layers 12. This structure of the electron supply layer may be applied to an inverse HEMT in which the electron supply layer is located beneath the active layer as shown in FIG. 18. Also in this fourth embodiment of the invention, the same effects as described in the third embodiment are obtained.

[Embodiment 5]

Figure 7:
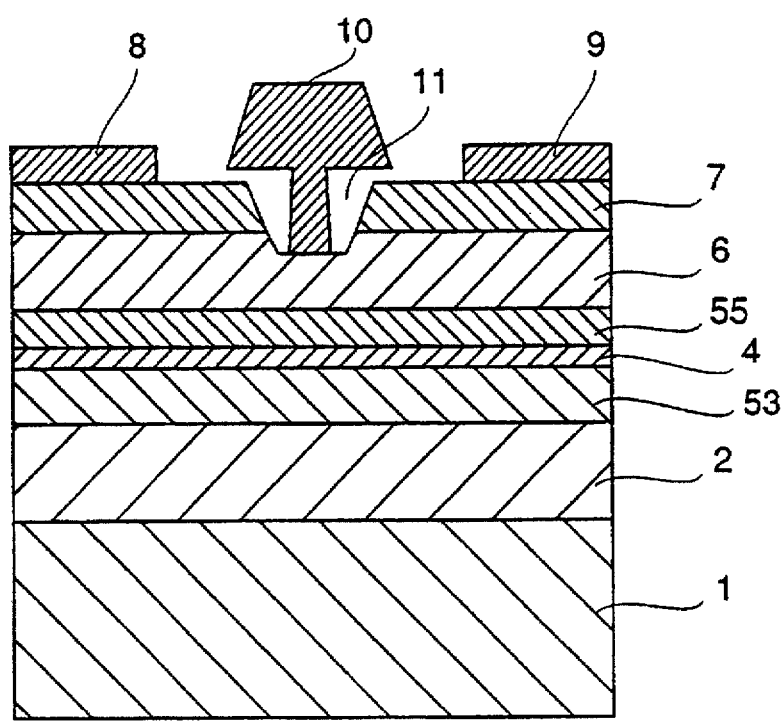
FIG. 7 is a sectional view illustrating a semiconductor device in accordance with a fifth embodiment of the present invention.
Figure 8:
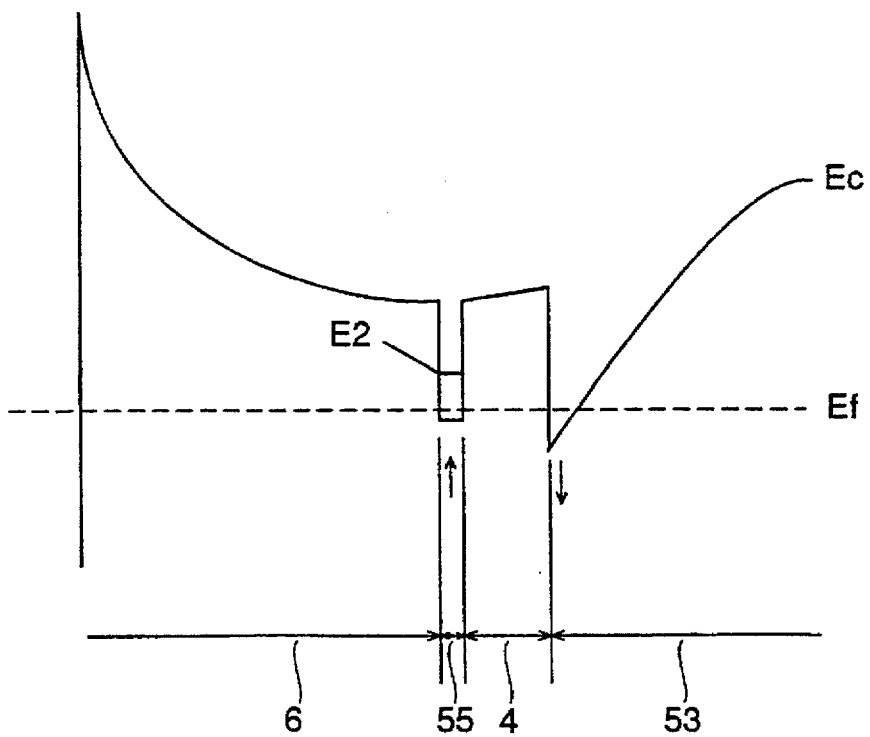
FIG. 8 is an energy band diagram of the semiconductor device according to the fifth embodiment of the invention.

FIG. 7 is a sectional view illustrating a semiconductor device in accordance with a fifth embodiment of the present invention. In the figure, the same reference numerals as in FIG. 1 designate the same or corresponding parts. Reference numeral 53 designates an undoped $In_yGa_{1-y}As$ ($0.53<y<1$) channel layer, and numeral 55 designates an n type $In_xGa_{1-x}As$ ($0<x<0.53$) electron supply layer. FIG. 8 is an energy band diagram of the semiconductor device shown in FIG. 7.

In the above-described first embodiment, InGaAs and AlInAs as materials of the semiconductor device have In composition ratios of 0.53 and 0.52, respectively, which are selected for lattice matching with the semi-insulating InP substrate. On the other hand, in this fifth embodiment of the invention, the In composition ratio y of the undoped $In_yGa_{1-y}As$ channel layer 53 is in a range of $0.53<y<1$, and the In composition ratio x of the n type $In_xGa_{1-x}As$ electron supply layer 55 is in a range of $0<x<0.53$, whereby the concentration of the two-dimensional electron gas is further increased.

More specifically, in this fifth embodiment, since the In composition ratio x of the electron supply layer 54 is smaller than 0.53, the In composition ratio of the electron supply layer 5 of the first embodiment, the conduction band edge of the electron supply layer is raised and the sub-band $E_2$ is also raised, whereby the depletion of the electron supply layer 55 becomes more conspicuous. In addition, since the In composition ratio y of the active layer 53 is larger than 0.53, the In composition ratio of the active layer 3 of the first embodiment, the conduction band edge of the active layer is lowered, whereby the induction of the two-dimensional electron gas in the triangular potential well is facilitated. Consequently, this structure provides a high concentration of the two-dimensional electron gas.

As described above, according to the fifth embodiment of the invention, in the HEMT including the InGaAs active layer, a very thin InGaAsP layer having a high n type dopant concentration is employed as the electron supply layer, and the composition ratio in Ga to In of the electron supply layer is higher than the composition ratio in Ga to In of the active layer. Therefore, in addition to the effects of the first embodiment, a high-performance HEMT having a high concentration two-dimensional electron gas is realized.

Meanwhile, a semiconductor device including an InGaAs channel layer in which the In composition ratio is increased to improve the operating characteristics of the device is disclosed in, for example, K. L. Tan et al. TRW Electronics & Technology Division "140 GHz 0.1 micron GATE-LENGTH PSEUDMORPHIC $In_{0.52}Al_{0.48}As/In_{0.60}Ga_{0.40}As/InP$ HEMT" IEEE IDEM 91, pp. 239–242, 1991 and K. B. Chough et al. AT & T "High-Performance Highly Strained $Ga_{0.23}In_{0.77}As/Al_{0.48}In_{0.52}As$ MODFET's Obtained by Selective and Shallow Etch Gate Recess Techniques" IEEE ELECTRON DEVICE LETTERS, Vol. 13, No. 9, pp. 451–453, 1992. However, the semiconductor device disclosed in these publications employ AlInAs for the electron supply layer. Since the lattice constant of InGaAs increases with an increase in the In composition ratio, the thicknesses of component layers of the device are strictly limited to the critical thicknesses, so that the degree of freedom in the design of the device is significantly limited.

In this fifth embodiment of the invention, however, since the electron supply layer comprises InGaAs and the In composition ratio is smaller than 0.53, the compressive strain applied to the crystal due to the active layer with increased In composition is reduced by the tensile strain applied to the crystal due to the electron supply layer, whereby the critical thickness of the crystal to the strain is increased. As a result, the restriction on the degree of freedom in the design of the device is relaxed.

[Embodiment 6]

Figure 19:
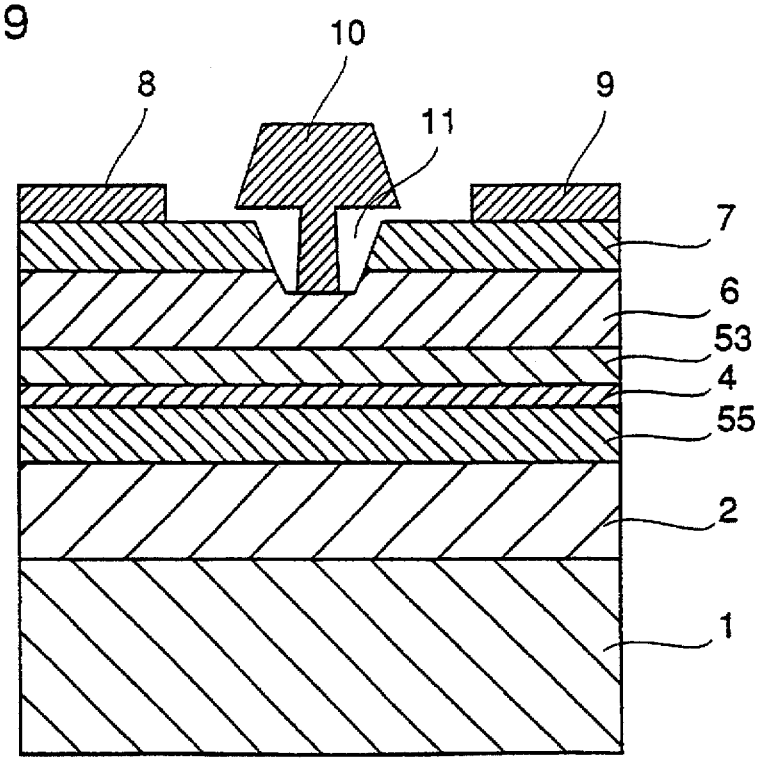
FIG. 19 is a sectional view illustrating a semiconductor device in accordance with a sixth embodiment of the present invention.

FIG. 19 is a sectional view illustrating a semiconductor device in accordance with a sixth embodiment of the present invention. In the figure, the same reference numerals as in FIG. 7 designate the same or corresponding parts.

In the above-described fifth embodiment, in the ordinary HEMT in which the electron supply layer is located above the active layer, the composition ratio of Ga to In of the electron supply layer is larger than the composition ratio of Ga to In of the active layer. In this sixth embodiment, this structure of the electron supply layer is applied to a reversed HEMT in which the electron supply layer is located beneath the active layer as shown in FIG. 19. Also in this case, the same effects as described in the fifth embodiment are achieved.

[Embodiment 7]

Figure 20:
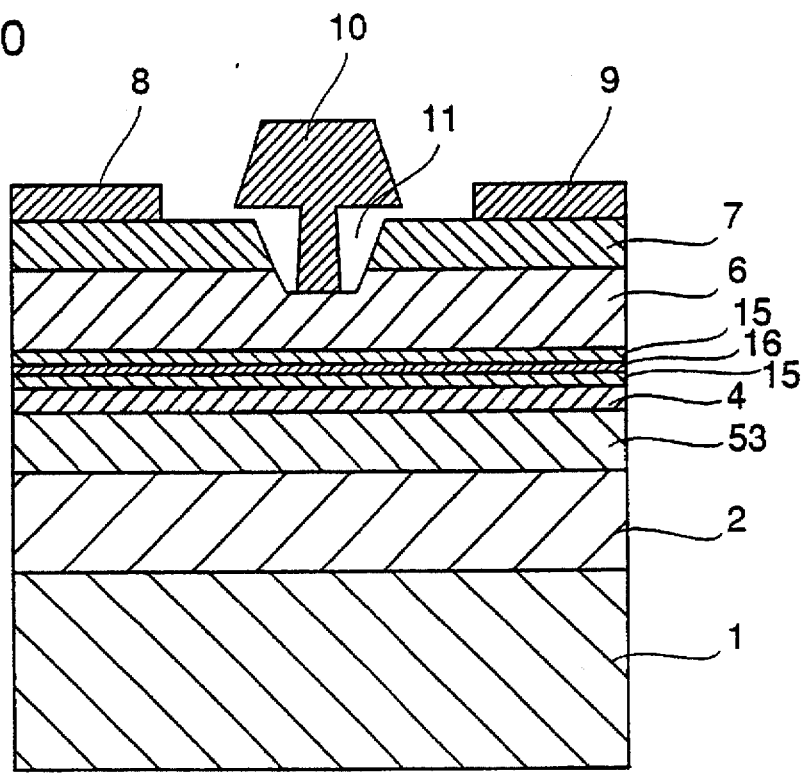
FIG. 20 is a sectional view illustrating a semiconductor device in accordance with a seventh embodiment of the invention.

FIG. 20 is a sectional view illustrating a semiconductor device in accordance with a seventh embodiment of the present invention. In the figure, the same reference numerals as in FIG. 7 designate the same or corresponding parts. Reference numeral 15 designates an undoped $In_xGa_{1-x}As$ ($0<x<0.53$) layer, and numeral 16 designates an atomic planar doped layer.

In the above-described fifth embodiment of the invention, in the ordinary HEMT structure, the composition ratio of Ga to In of the InGaAs electron supply layer that is entirely doped with an n type impurity is higher than the composition ratio of Ga to In of the active layer. In this seventh embodiment of the invention, as in the HEMT structure described in the fifth embodiment, an electron supply layer has a multilayer structure in which an n type impurity atomic planar doped layer 16 is interposed between a pair of very low impurity concentration InGaAs layers 15, and the composition ratio of Ga to In of the electron supply layer is larger than the composition ratio of Ga to In of the active layer.

Also in this seventh embodiment, the same effects as described in the fifth embodiment are obtained. Furthermore, since diffusion of n type impurities in the electron supply layer into other layers is suppressed, a steep band discontinuity is produced, thereby increasing the concentration of the two-dimensional electron gas.

[Embodiment 8]

Figure 21:
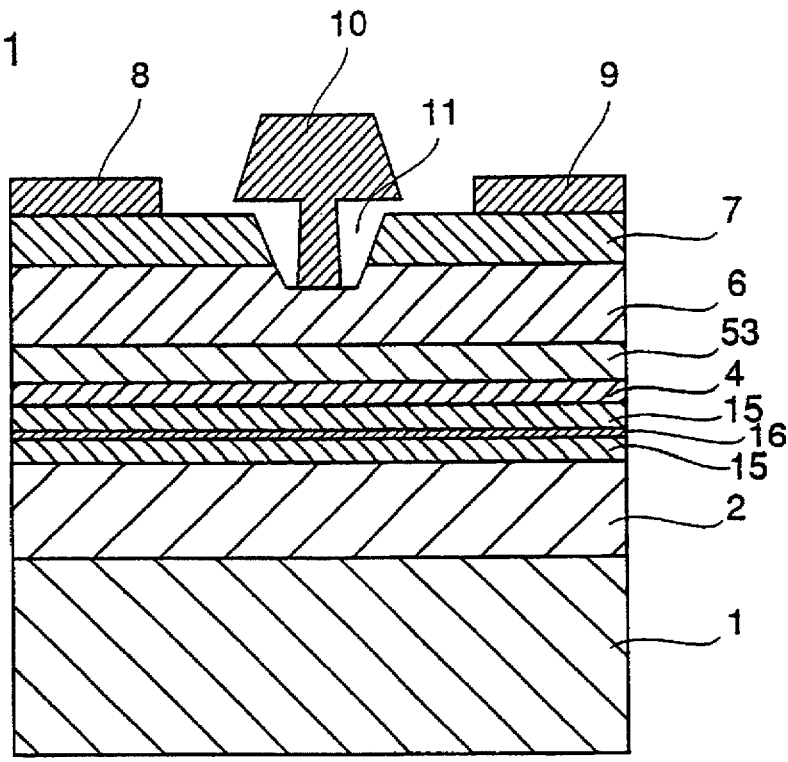
FIG. 21 is a sectional view illustrating a semiconductor device in accordance with an eighth embodiment of the invention.

FIG. 21 is a sectional view illustrating a semiconductor device in accordance with an eighth embodiment of the present invention. In the figure, the same reference numerals as in FIG. 20 designate the same or corresponding parts.

In the above-described sixth embodiment of the invention, in the reversed HEMT structure, the composition ratio of Ga to In of the InGaAs electron supply layer that is entirely doped with an n type impurity is higher than the composition ratio of Ga to In of the active layer. In this eighth embodiment of the invention, in a reversed HEMT structure as described in the sixth embodiment, an electron supply layer has a multilayer structure in which an n type impurity atomic planar doped layer 16 is interposed between a pair of very low impurity concentration InGaAs layers 15, and the composition ratio of Ga to In of the electron supply layer is larger than the composition ratio of Ga to In of the active layer.

Also in this eighth embodiment, the same effects as described in the sixth embodiment are obtained. Further, since diffusion of n type impurities in the electron supply layer into other layers is suppressed, a steep band discontinuity is produced, thereby increasing the concentration of the two-dimensional electron gas.

[Embodiment 9]

Figure 9:
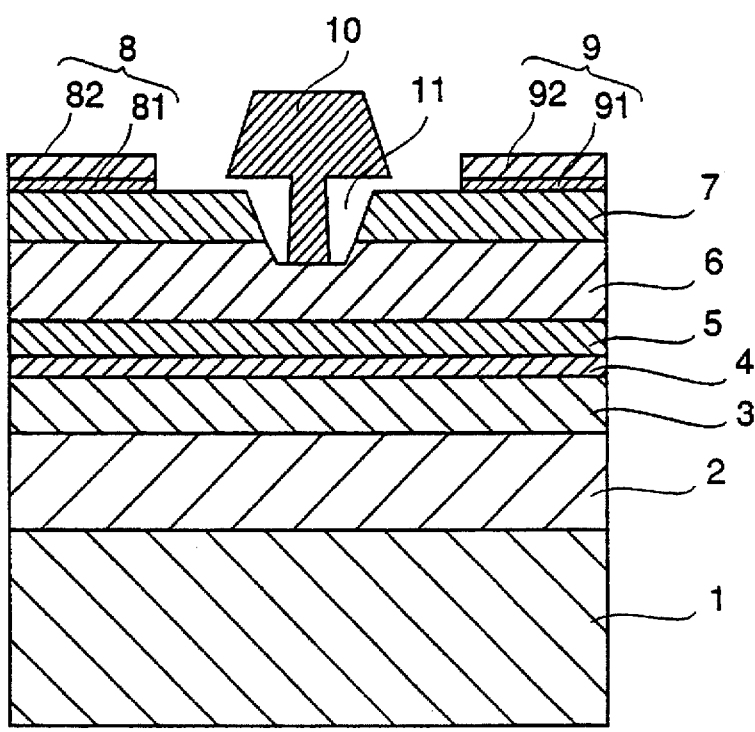
FIG. 9 is a sectional view illustrating a semiconductor device in accordance with a ninth embodiment of the present invention.

FIG. 9 is a sectional view illustrating a semiconductor device in accordance with a ninth embodiment of the present invention. In the figure, the same reference numerals as in FIG. 1 designate the same or corresponding parts. In this ninth embodiment, the source electrode 8 comprises a WSi layer 81 in contact with the n type InGaAs contact layer 7 and an Au layer 82 disposed on the WSi layer 81. The drain electrode 9 comprises a WSi layer 91 in contact with the n type InGaAs contact layer 7 and an Au layer 92 disposed on the WSi layer 91.

Figure 10:
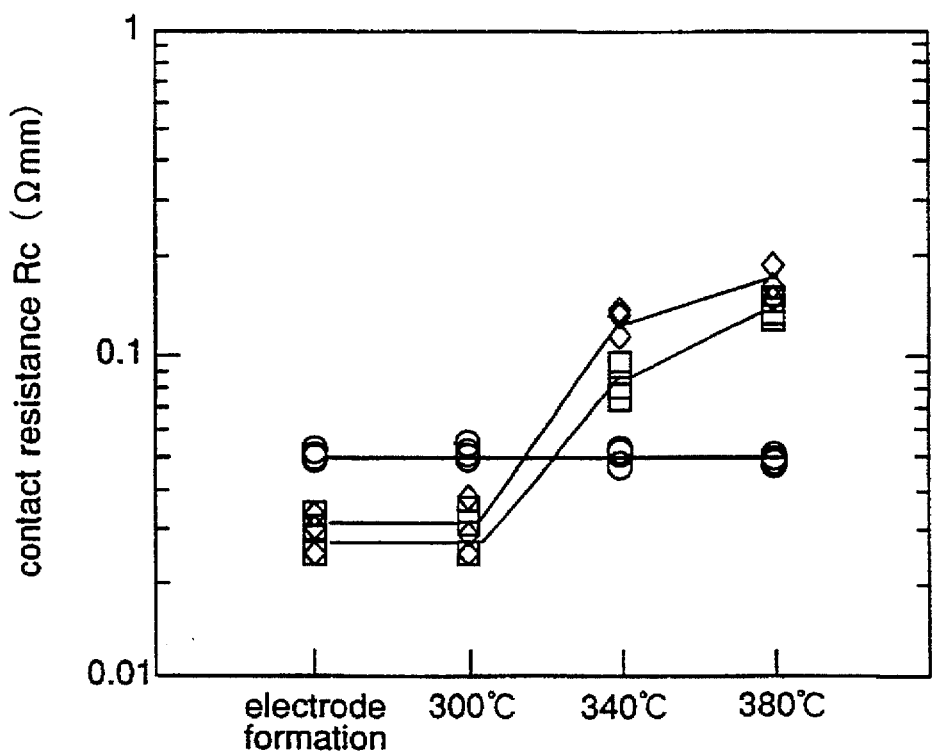
FIG. 10 is a graph for explaining the thermal stability of contact resistance of the semiconductor device according to the ninth embodiment of the present invention.

FIG. 10 is a graph illustrating temperature dependence of contact resistance when a semiconductor device including a WSi base metal electrode on an n type InGaAs contact layer is subjected to heat treatment at different temperatures. In the figure, the abscissa shows the heat treatment temperature and the ordinate shows the contact resistance $R_C$. In addition, ○ represents variations in the contact resistance of the semiconductor device according to the ninth embodiment of the invention. For comparison, variations in contact resistances of semiconductor devices including an AuGe base metal electrode and a Ti base metal electrode on n type InGaAs contact layers are represented by ◊ and □, respectively.

As seen from FIG. 10, when the electrode on the n type InGaAs contact layer comprises AuGe base metal or Ti base metal, the contact resistance shows a considerable increase when the temperature of the heat treatment exceeds 300° C. On the other hand, when the electrode on the n type InGaAs contact layer comprises WSi base metal, the contact resistance does not vary even in heat treatment at 380° C. That is, WSi base metal has a very high thermal stability compared to AuGe base metal and Ti base metal that are used for source and drain electrodes in the conventional semiconductor device.

In this ninth embodiment of the invention, since the thermally stable WSi base metal is used for the source and drain electrodes on the n type InGaAs contact layer, a thermally stable semiconductor device is realized.

Although the resistance of WSi base metal is higher than the resistance of AuGe base metal, since the source (drain) electrode 8 (9) of this ninth embodiment has a double-layer structure in which the Au layer 82 (92) is disposed on the WSi layer 81 (91), the resistance of the current path in the direction parallel to the surface of the electrode is reduced. Further, although WSi base metal is thermally stable regardless of the composition ratio of W to Si, the absolute value of the contact resistance varies according to the composition ratio. In this ninth embodiment of the invention, for example, $W_{0.8}Si_{0.2}$ is employed.

According to the ninth embodiment of the present invention, the ohmic electrodes, i.e., the source and drain electrodes, on the n type InGaAs contact layer include the $W_{1-x}Si_x$ ($0 \leq x \leq 1$) layers in contact with the contact layer, an unwanted increase in the contact resistance due to thermal processing is avoided, resulting in a thermally stable semiconductor device.

While in the above-described ninth embodiment the source and drain electrodes of the semiconductor device as described in the first embodiment include the $W_{1-x}Si_x$ ($0 \leq x \leq 1$) layers in contact with the contact layer, this structure of the source and drain electrodes may be applied to the semiconductor devices according to the second to eighth embodiments of the invention with the same effects as described above.

[Embodiment 10]

Figure 11:
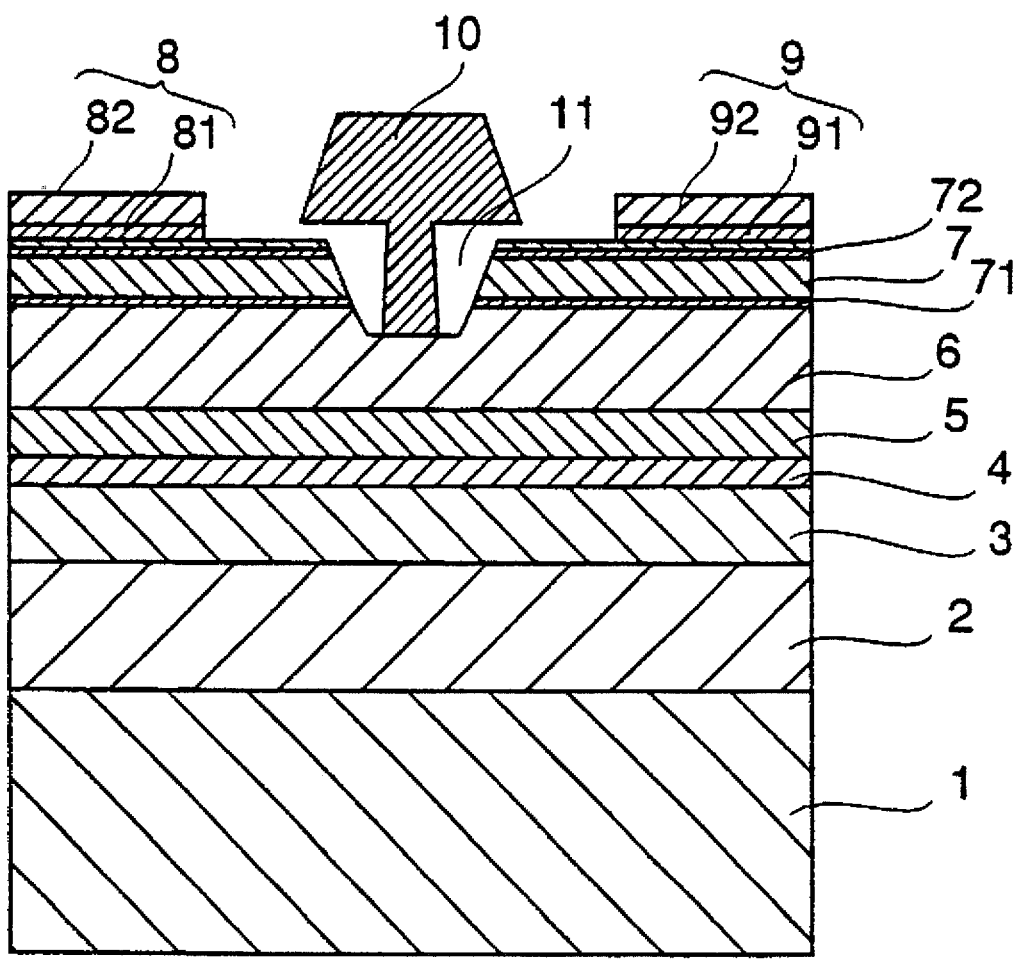
FIG. 11 is a sectional view illustrating a semiconductor device in accordance with a tenth embodiment of the present invention.
Figure 12:
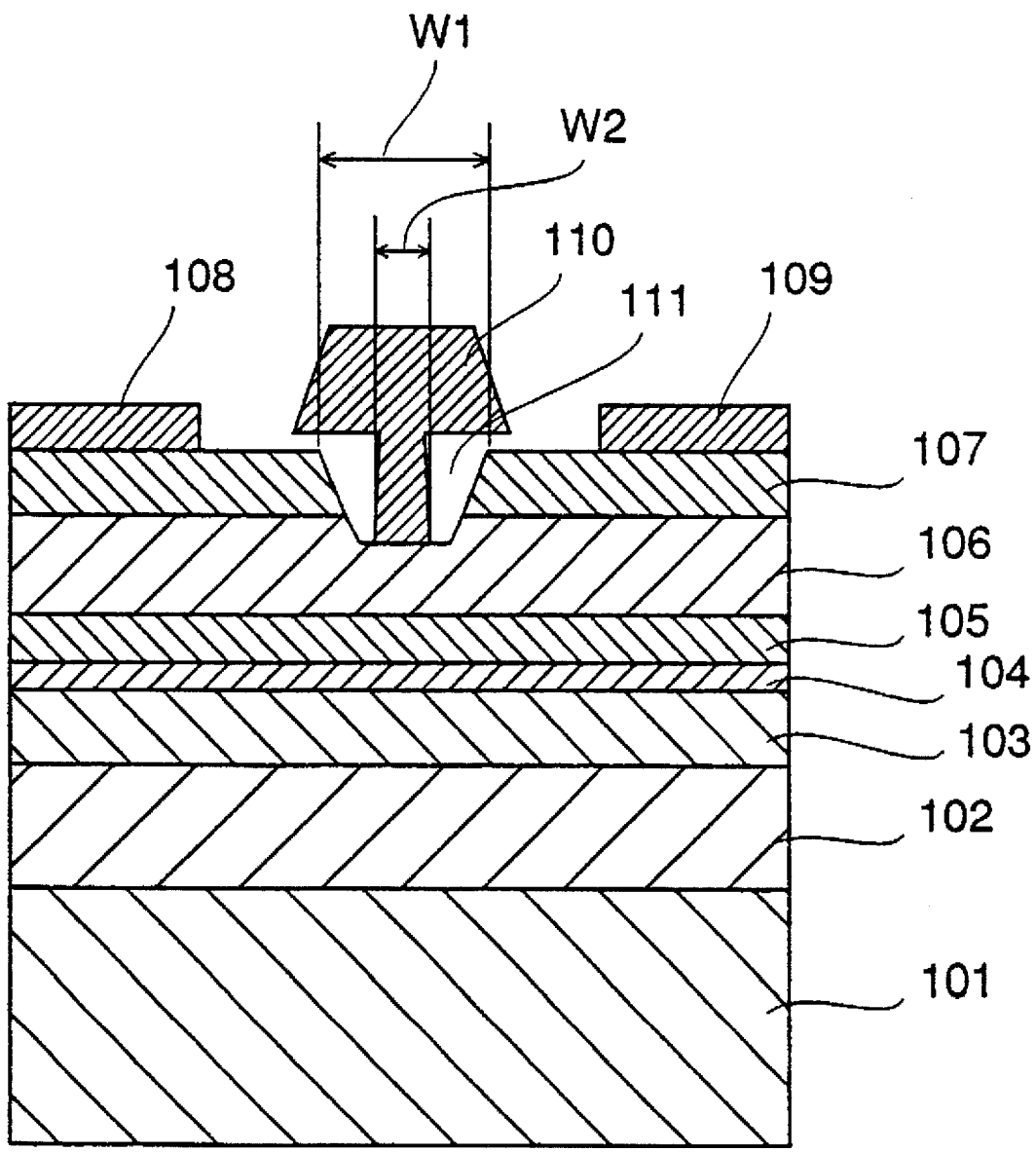
FIG. 12 is a sectional view illustrating a conventional HEMT comprising InGaAs and AlInAs.
Figure 13:
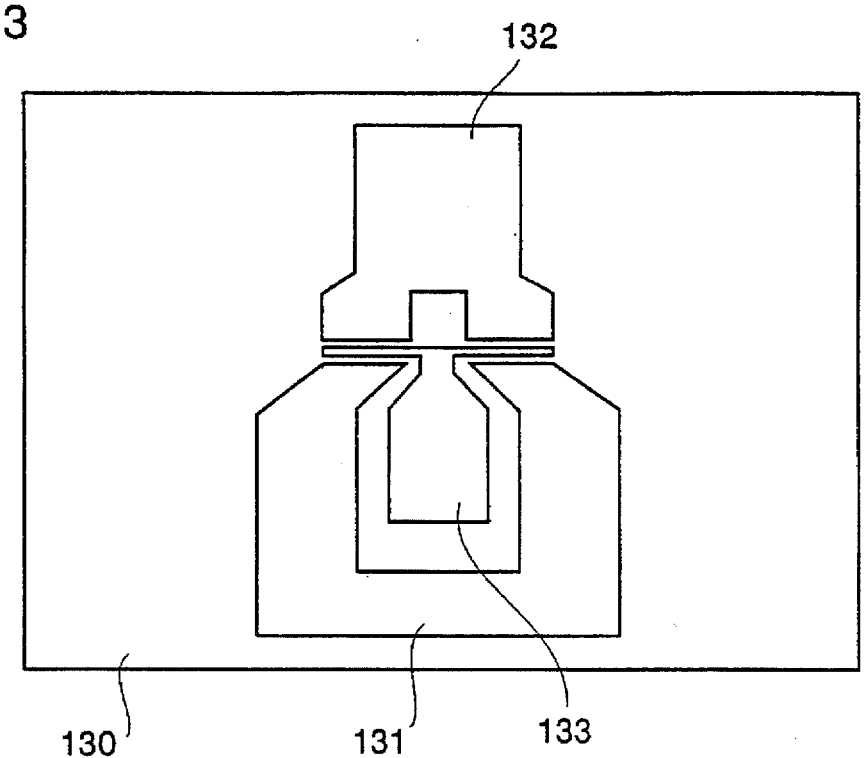
FIG. 13 is a plan view of a conventional HEMT on a chip, illustrating planar forms and the arrangement of gate, source, and drain electrodes.
Figure 14:
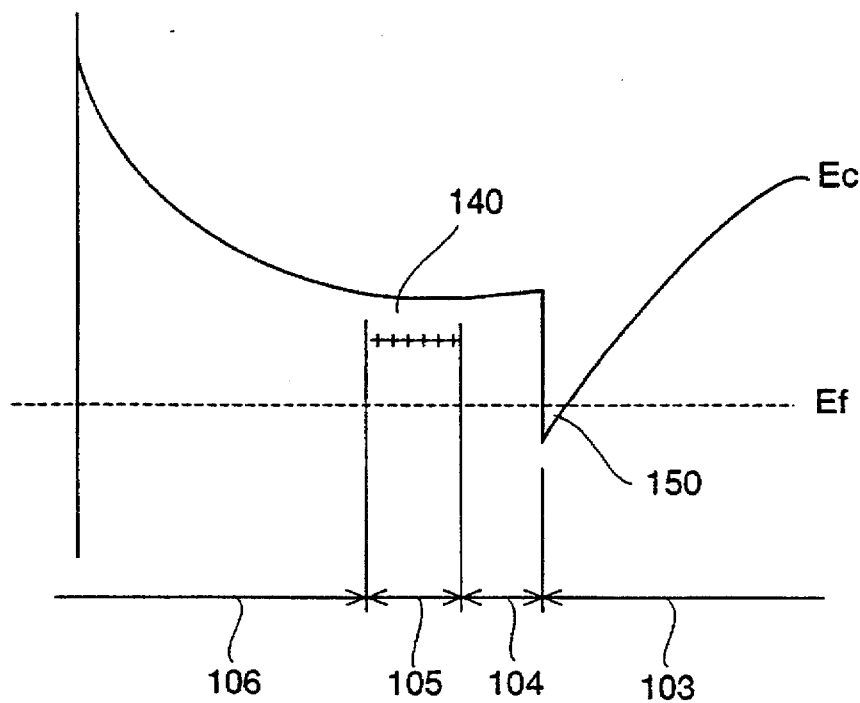
FIG. 14 is an energy band diagram of the HEMT shown in FIG. 12.
Figure 15:
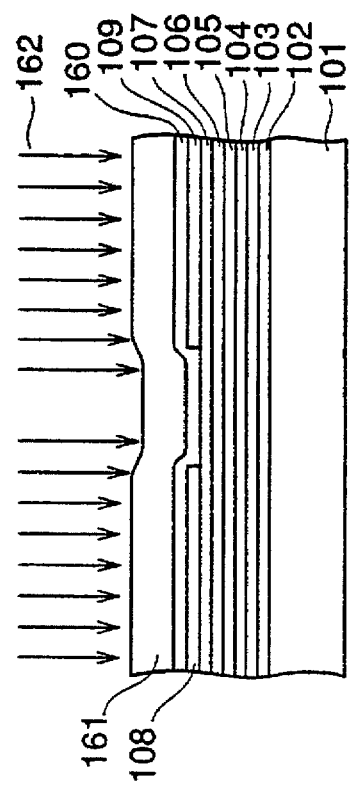
FIGS. 15(a)–15(j) are sectional views illustrating process steps in a method of fabricating the conventional HEMT.
Figure 15:
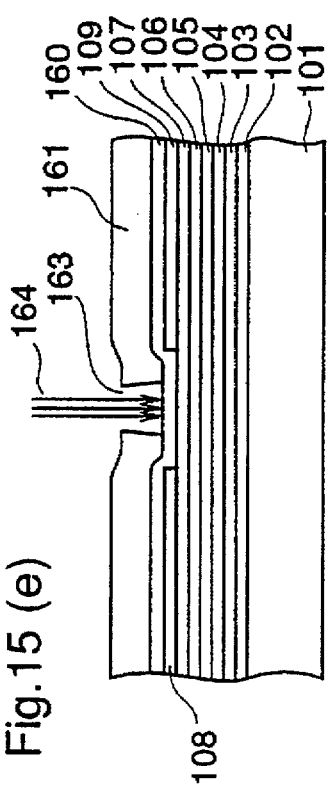
Figure 15:
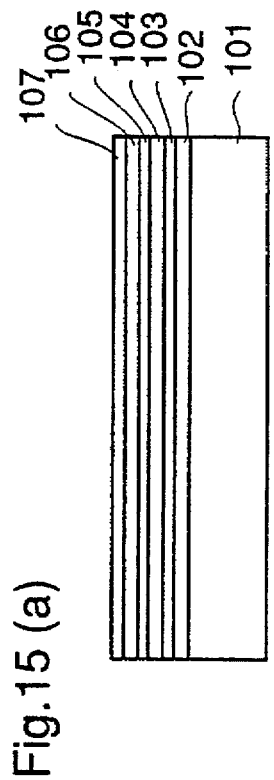
Figure 15:
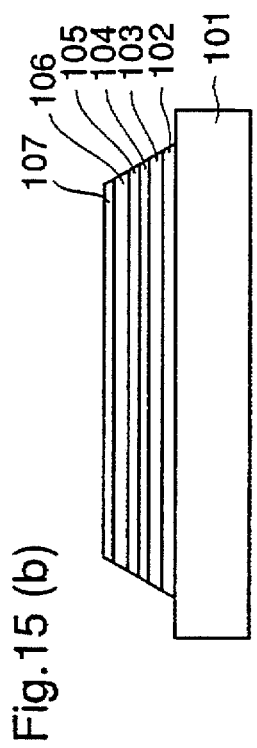
Figure 15:
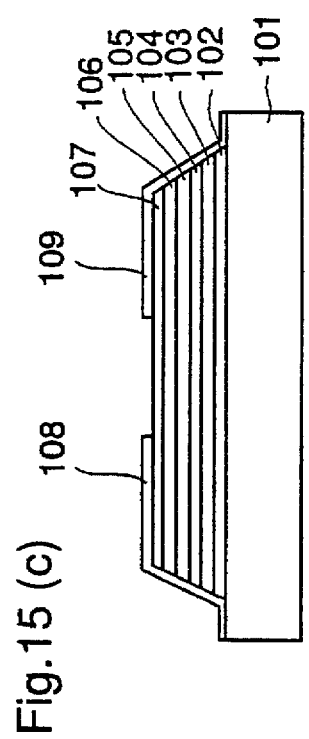
Figure 16:
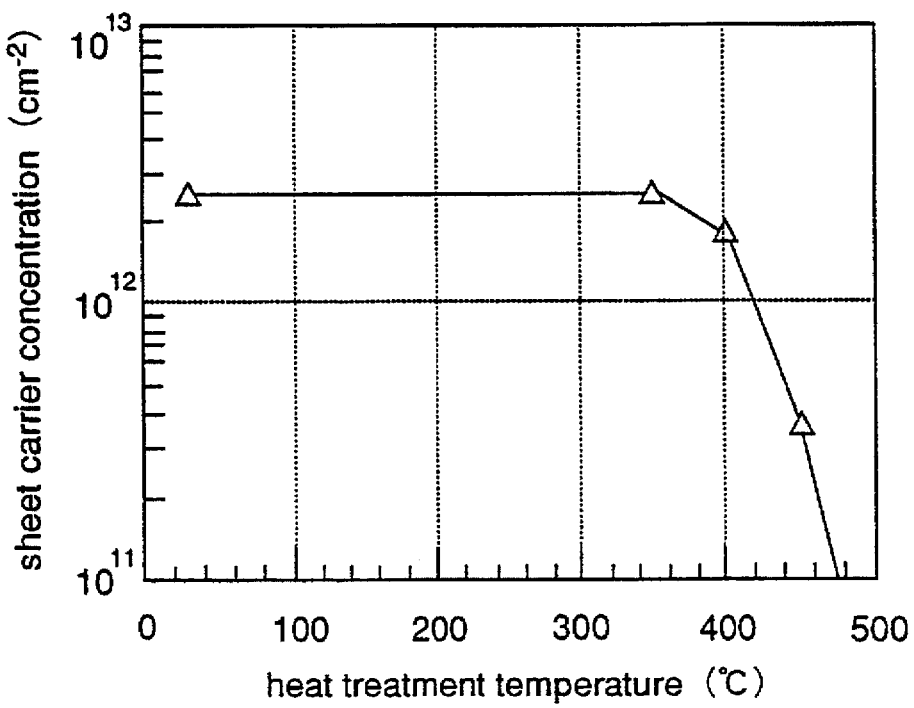
FIG. 16 is a graph illustrating the variation in sheet carrier concentration when the conventional HEMT shown in FIG. 12 is heated in a nitrogen atmosphere.
Figure 17:
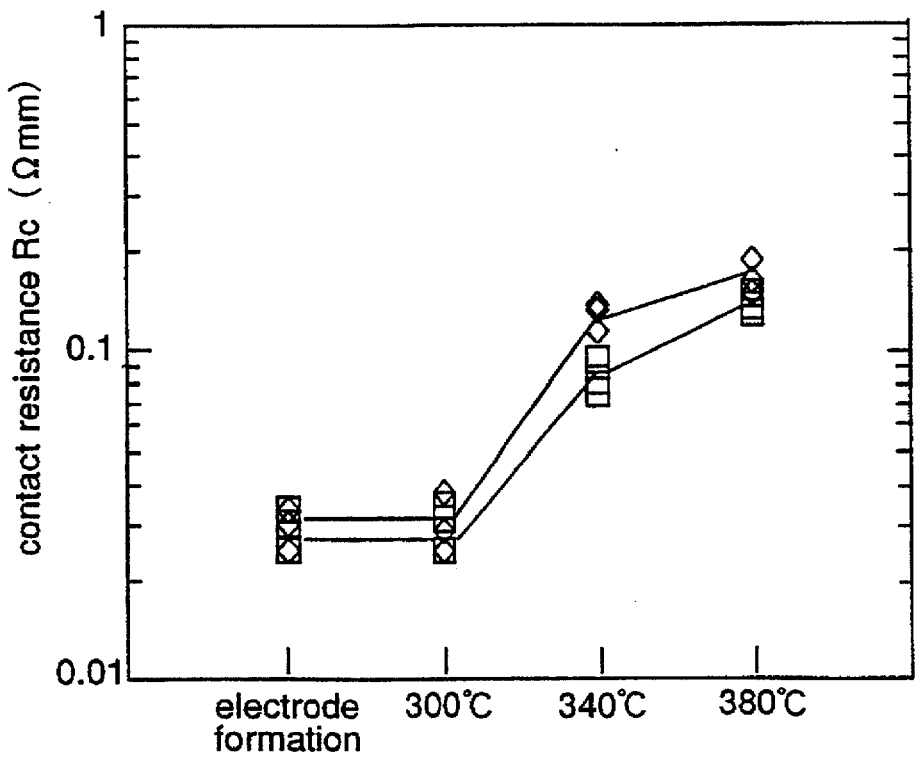
FIG. 17 is a graph illustrating the variation in contact resistance when the HEMT shown in FIG. 12 is annealed.

FIG. 11 is a sectional view of a semiconductor device in accordance with a tenth embodiment of the present invention. In the figure, the same reference numerals as in FIG. 1 designate the same or corresponding parts. Reference numerals 71 and 72 designate n type impurity atomic planar doped layers.

In the above-described ninth embodiment, since $W_{1-x}Si_x$ base metal is used for the source and drain electrodes, a potential barrier is produced at the interface between the electrodes and the contact layer because it is difficult to alloy the electrodes with the semiconductor contact layer. In this case, a satisfactory contact is obtained by lowering the conduction band edge of the semiconductor layer. When two dissimilar materials are connected (heterojunction), a potential barrier is produced at the interface (heterointerface) due to a difference in band gap energies between the two materials, and the potential barrier reduces the electron mobility between the two materials. Therefore, if the potential barrier can be lowered, the resistance between the source and drain electrodes is reduced, resulting in a high-performance semiconductor device.

As a measure for lowering the potential barrier, an atomic planar doping of n type impurity is effective.

In this tenth embodiment of the invention, an n type impurity atomic planar doped layer 72 is disposed in the vicinity of the surface of the n type InGaAs contact layer 7, whereby the conduction band of the surface region of the contact layer is raised. Further, since an n type impurity atomic planar doped layer 71 is interposed between the n type InGaAs contact layer 7 and the undopad AlInAs Schottky layer 6, the potential barrier at the heterointerface is lowered.

As described above, in this tenth embodiment of the invention, in the semiconductor device having the source and drain electrodes including the $W_{1-x}Si_x$ ($0 \leq x \leq 1$) base metal layers in contact with the contact layer, using an atomic planar doping technique, an n type dopant impurity is doped into a region of the contact layer in the vicinity of the interface between the contact layer and the source and drain electrodes and into a region at the interface between the contact layer and the Schottky layer, whereby the source to drain resistance is reduced, resulting in a high performance semiconductor device.

The structure of the atomic planar doped layer in the contact layer or at the interface between the contact layer and the Schottky layer may be applied to semiconductor devices according to the second to eighth embodiments of the invention with the same effects as described in the tenth embodiment.

Although in the above-described tenth embodiment the atomic planar doped layers 71 and 72 are disposed at the interface between the contact layer and the Schottky layer and in the contact layer, respectively, even when one of the atomic planar doped layers is absent, the source to drain resistance is reduced.

What is claimed is:

1. A semiconductor device structure utilizing a two-dimensional electron gas including:
   a semiconductor substrate;
   an InGaAs active layer having a very low dopant impurity concentration and comprising a material having an electron affinity in which a two-dimensional electron gas is produced;
   a spacer layer having opposite first and second surfaces and contacting the active layer at the first surface, the spacer layer having a very low dopant impurity concentration and comprising a material having an electron affinity smaller than the electron affinity of the active layer; and
   a very thin InGaAs electron supply layer having a high n type dopant impurity concentration and contacting the second surface of the spacer layer.

2. The semiconductor device structure of claim 1 wherein the spacer layer comprises AlInAs.

3. The semiconductor device structure of claim 1 wherein the active layer and the spacer layer have dopant impurity concentrations on the order of no more than $10^{16}$ cm$^{-3}$.

4. The semiconductor device structure of claim 1 wherein the electron supply layer is about 1 nm thick.

5. The semiconductor device structure of claim 1 wherein the electron supply layer is entirely doped with an n type dopant impurity to a concentration on the order of at least $10^{18}$ cm$^{-3}$.

6. The semiconductor device structure of claim 1 wherein the electron supply layer includes an n type layer that is formed by atomic planar doping of an n type dopant impurity into a very low dopant impurity concentration InGaAs layer.

7. The semiconductor device structure of claim 6 wherein the electron supply layer is about 1 nm thick and the n type layer formed by atomic planar doping has a sheet carrier concentration on the order of $10^{12}$ cm$^{-2}$.

8. The semiconductor device structure of claim 1 wherein the InGaAs electron supply layer has a composition ratio of Ga to In larger than a Ga to In composition ratio of the InGaAs active layer.

9. The semiconductor device structure of claim 8 wherein the substrate comprises InP, the electron supply layer comprises $In_xGa_{1-x}As$ ($0<x<0.53$), and the active layer comprises $In_yGa_{1-y}As$ ($0.53<y<1$).

10. The semiconductor device structure of claim 1 wherein the active layer opposite first and second surfaces, the first surface contacting the substrate, the spacer layer contacting the second surface of the active layer, and including:
    a Schottky layer having a very low dopant impurity concentration and comprising a material having an electron affinity smaller than the electron affinity of the active layer, the Schottky layer being disposed on the electron supply layer;
    a gate electrode disposed on the Schottky layer, making a Schottky junction with the Schottky layer;
    InGaAs contact layers having a high n type dopant impurity concentration and disposed on portions of the Schottky layer at opposite sides of the gate electrode; and
    spaced apart source and drain electrodes respectively disposed on the InGaAs contact layers.

11. The semiconductor device structure of claim 1 wherein the active layer has opposite first and second surfaces, the first surface contacting the substrate, the spacer layer contacting the first surface of the active layer, and including:
    a Schottky layer having a very low dopant impurity concentration and comprising a material having an electron affinity smaller than the electron affinity of the active layer, the Schottky layer contacting the second surface of the active layer;
    a gate electrode disposed on the Schottky layer, making a Schottky junction with the Schottky layer;
    InGaAs contact layers having a high n type dopant impurity concentration and disposed on portions of the Schottky layer at opposite sides of the gate electrode; and
    spaced apart source and drain electrodes respectively disposed on the InGaAs contact layers.

12. The semiconductor device structure of claim 10 wherein the Schottky layer has a dopant impurity concentration on the order of no more than $10^{16}$ cm$^{-3}$.

13. The semiconductor device structure of claim 11 wherein the Schottky layer has a dopant impurity concentration on the order of no more than $10^{16}$ cm$^{-3}$.

14. The semiconductor device structure of claim 10 wherein the source and drain electrodes include $W_{1-x}Si_x$ ($0 \leq x \leq 1$) base metal layers in contact with the contact layers.

15. The semiconductor device structure of claim 11 wherein the source and drain electrodes include $W_{1-x}Si_x$ ($0 \leq x \leq 1$) base metal layers in contact with the contact layers.

16. The semiconductor device structure of claim 14 wherein the source and drain electrodes include Au layers on the respective $W_{1-x}Si_x$ ($0 \leq x \leq 1$) base metal layers.

17. The semiconductor device structure of claim 15 wherein the source and drain electrodes include Au layers on the respective $W_{1-x}Si_x$ ($0 \leq x \leq 1$) base metal layers.

18. The semiconductor device structure of claim 14 wherein the contact layers include n type regions at respective interfaces between the contact layers and the source and drain electrodes, the n type regions having been formed by atomic planar doping with an n type dopant impurity.

19. The semiconductor device structure of claim 15 wherein the contact layers include n type regions at respective interfaces between the contact layers and the source and drain electrodes, the n type regions having been formed by atomic planar doping with an n type dopant impurity.

20. The semiconductor device structure of claim 14 wherein the contact layers include n type regions at respective interfaces between the contact layers and the Schottky layer, the n type regions having been formed by atomic planar doping with an n type dopant impurity.

21. The semiconductor device structure of claim 15 wherein the contact layers include n type regions at respective interfaces between the contact layers and the Schottky layer, the n type regions having been formed by atomic planar doping with an n type dopant impurity.

\* \* \* \* \*